(12) United States Patent
Miyamoto et al.

(10) Patent No.: US 11,209,499 B2
(45) Date of Patent: Dec. 28, 2021

(54) DISTRIBUTION BOARD

(71) Applicant: Nitto Kogyo Corporation, Nagakute (JP)

(72) Inventors: Atsushi Miyamoto, Nagakute (JP); Hiroyuki Ito, Nagakute (JP)

(73) Assignee: Nitto Kogyo Corporation, Nagakute (JP)

( * ) Notice: Subject to any disclaimer, the term of this patent is extended or adjusted under 35 U.S.C. 154(b) by 0 days.

(21) Appl. No.: 17/046,184

(22) PCT Filed: Apr. 11, 2019

(86) PCT No.: PCT/JP2019/015780
§ 371 (c)(1),
(2) Date: Oct. 8, 2020

(87) PCT Pub. No.: WO2019/198791
PCT Pub. Date: Oct. 17, 2019

(65) Prior Publication Data
US 2021/0035750 A1    Feb. 4, 2021

(30) Foreign Application Priority Data

Apr. 13, 2018 (JP) .............................. JP2018-077463
Apr. 13, 2018 (JP) .............................. JP2018-077464
(Continued)

(51) Int. Cl.
*G01R 31/52* (2020.01)
*G01R 31/327* (2006.01)
(Continued)

(52) U.S. Cl.
CPC ............. *G01R 31/52* (2020.01); *G01R 19/10* (2013.01); *G01R 23/15* (2013.01); *G01R 31/12* (2013.01); *G01R 31/327* (2013.01); *H01H 9/50* (2013.01)

(58) Field of Classification Search
CPC ...... G01R 31/00; G01R 31/12; G01R 31/327; G01R 31/50; G01R 31/52; G01R 31/74;
(Continued)

(56) References Cited

U.S. PATENT DOCUMENTS 5,563,921 A * 10/1996 Mesuda .................. H03L 7/093
327/156
9,031,799 B2 * 5/2015 Bae .......................... H04Q 9/00
702/58

(Continued)

FOREIGN PATENT DOCUMENTS

JP        H6209518 A      7/1994
JP        H1075525 A      3/1998
(Continued)

*Primary Examiner* — Hoai-An D. Nguyen
(74) *Attorney, Agent, or Firm* — The Webb Law Firm

(57) ABSTRACT

The present invention provides a distribution board having a main breaker and a plurality of branch breakers, the distribution board being wired to branch power supplied to the main breaker into each branch breaker, the distribution board including: a plurality of noise detection sections configured to correspond to the respective branch breakers one-to-one and each configured to output a detection signal based on a noise component of not less than a predetermined frequency generated on a secondary side of each branch breaker; and processor configured to separately receive the detection signal output from each noise detection section and determine whether the detection signal is high frequency noise at a threshold or more.

10 Claims, 23 Drawing Sheets

(30) Foreign Application Priority Data

Nov. 13, 2018 (JP) .............................. JP2018-213066
Jan. 29, 2019 (JP) .............................. JP2019-013182

(51) Int. Cl.
*G01R 23/15* (2006.01)
*G01R 19/10* (2006.01)
*H01H 9/50* (2006.01)
*G01R 31/12* (2020.01)

(58) Field of Classification Search
CPC ........ G01R 19/00; G01R 19/10; G01R 23/00;
G01R 23/02; G01R 23/15; H01H 9/00;
H01H 9/50; H01H 33/00; H01H 33/02;
H01H 33/26; H01H 1/00; H01H 1/0015;
H01H 83/00; H01H 83/02; H01H 83/04
USPC .................................................. 324/415, 425
See application file for complete search history.

(56) References Cited

U.S. PATENT DOCUMENTS 9,490,611 B2 * 11/2016 Westrick, Jr. ............ H02B 1/32

| | | | |
|---|---|---|---|
| 2002/0021170 A1 * | 2/2002 | Nakayama | H03F 1/3229 330/52 |
| 2006/0064258 A1 * | 3/2006 | Mochizuki | G01R 29/26 702/69 |
| 2009/0086864 A1 * | 4/2009 | Komninakis | H04B 1/109 375/346 |
| 2009/0284265 A1 | 11/2009 | Ohta et al. | |
| 2010/0027804 A1 * | 2/2010 | Kano | G10K 11/17873 381/71.11 |
| 2013/0221977 A1 | 8/2013 | Ukil et al. | |
| 2016/0238639 A1 | 8/2016 | Tadano | |

FOREIGN PATENT DOCUMENTS

| | | |
|---|---|---|
| JP | 2001124814 A | 5/2001 |
| JP | 2004226299 A | 8/2004 |
| JP | 2009245792 A | 10/2009 |
| JP | 2009278744 A | 11/2009 |
| JP | 2014134445 A | 7/2014 |
| JP | 2016130650 A | 7/2016 |
| JP | 2017173008 A | 9/2017 |
| WO | 2015063943 A1 | 5/2015 |
| WO | 2017187481 A1 | 11/2017 |

* cited by examiner

FIRST NOISE DETECTION SECTION

SECOND NOISE DETECTION SECTION

SEVENTH NOISE DETECTION SECTION

EIGHTH NOISE DETECTION SECTION

REFRIGERATOR

AIR CONDITIONER

TELEVISION SET

MICROWAVE OVEN

CURRENT WAVEFORM DATA COMPARISON PROCESSING

MEASURED CURRENT WAVEFORM DATA     STORED CURRENT WAVEFORM DATA

CURRENT WAVEFORM DATA COMPARISON PROCESSING

DISTRIBUTION BOARD

CROSS-REFERENCE TO RELATED APPLICATIONS

This application is the United States national phase of International Application No. PCT/JP2019/015780 filed Apr. 11, 2019, and claims priority to Japanese Patent Application Nos. 2018-077463 and 2018-077464, filed Apr. 13, 2018, Japanese Patent Application No. 2018-213066 filed Nov. 13, 2018, and Japanese Patent Application No. 2019-013182 filed Jan. 29, 2019, the disclosures of which are hereby incorporated by reference in their entirety.

TECHNICAL FIELD

The present invention relates to a distribution board including a main breaker and a plurality of branch breakers, and specifically relates to a distribution board capable of detecting an abnormal discharge phenomenon occurred on a secondary side of each branch breaker.

BACKGROUND ART

Distribution boards are used to distribute, for example, power supplied from a power company to a plurality of areas in a building. A general Distribution board includes a main breaker and a plurality of branch breakers and is wired to branch the power supplied to the main breaker into each branch breaker. For example, the respective branch breakers of a residential distribution board are electrically connected to lighting fixtures, receptacles, and the like provided in a plurality of areas in the residence. Such a distribution board has a function of monitoring the power supplied to the building to prevent excessive consumption of power and current leakage. That is, the main breaker and each branch breaker are provided with an open/close switch. When the total current flowing in each branch breaker exceeds a preset value or occurrence of current leakage is detected, the main breaker opens the open/close switch breaks the power supply to the secondary side. Meanwhile, when a current exceeding the preset value flows, the respective branch breakers open the open/close switch to break the power supply to the secondary side.

As described above, the main breaker is provided with a leakage breaking function. However, a discharge phenomenon due to tracking and a short circuit is a cause of electrical fires. The leakage breaking function of the main breaker is not capable of detecting a discharge phenomenon to prevent an electrical fire before starting. Various configurations have thus been proposed to detect a discharge phenomenon due to tracking, a short circuit, disconnection, and the like.

Japanese Patent Application Kokai Publication No. 2009-278744 discloses an arc detecting device including a time series data acquisition unit, a basic data generator, a data processor, and an arc judging unit. The time series data acquisition unit acquires time series data concerning the characteristic quantities of a current or a voltage in a circuit. The basic data generator generates basic data made of a plurality of frequency components through frequency analysis from the time series data. The data processor statistically processes the basic data, thereby converting the basic data to an evaluation value highly correlative to an occurrence of the arc. The arc judging unit judges the occurrence of the arc, if the evaluation value exceeds a predetermined arc judgment threshold value.

Japanese Patent Application Kokai Publication No. 2014-134445 discloses an arc detector including a voltage sensor, a power spectrum transformation device, and an arc determination device. The voltage sensor detects a voltage between terminals of a switch to open and close a direct current circuit. The power spectrum transformation device transforms output from the voltage sensor to a power spectrum. The arc determination device determines whether an arc occurs in the direct current circuit from the slope of the power spectrum.

WO 2015/063943 discloses a signal processing system including a measurement apparatus and a processing apparatus. The measurement apparatus measures a current and a voltage which are supplied to a plurality of electric devices from a power supply. The processing apparatus estimates operation conditions of the respective electric devices from a measurement result of the measurement apparatus. The measurement apparatus converts analog waveform data of the current and the voltage into digital waveform data. The processing apparatus separates the digital waveform data into pieces of digital waveform data for the respective electric devices. The processing apparatus further analyzes the separated pieces of digital waveform data and estimates the operation conditions of the respective electric devices.

Japanese Patent Application Kokai Publication No. 2017-173008 discloses a system to detect high frequency noise due to a discharge phenomenon by a CR circuit. The CR circuit has a configuration in which a capacitor and a resistor are serially connected and is electrically connected between different electrodes of a circuit. Such a CR circuit passes noise components of not less than a predetermined frequency. Measurement of the value of the voltage applied to both ends of the resistor in the CR circuit allows detection of an abnormal discharge phenomenon.

PRIOR ART DOCUMENTS

Patent Document

Patent Document 1: Japanese Patent Application Kokai Publication No. 2009-278744
Patent Document 2: Japanese Patent Application Kokai Publication No. 2014-134445
Patent Document 3: WO 2015/063943
Patent Document 4: Japanese Patent Application Kokai Publication No. 2017-173008

DISCLOSURE OF THE INVENTION

Problems to be Solved by the Invention

<Frequency Analysis>
A discharge phenomenon due to due to tracking and a short circuit causes superimposition of high frequency noise on a current and a voltage. The high frequency noise generated by such a discharge phenomenon has to be detected by frequency analysis of the current or the voltage (refer to Japanese Patent Application Kokai Publication No. 2009-278744, Japanese Patent Application Kokai Publication No. 2014-134445, and WO 2015/063943). However, the frequency analysis includes separating waveform data of a plurality of electrical appliances and analyzing the presence of high frequency noise for each piece of the separated waveform data. There is thus a problem of complex processing.

Meanwhile, the CR circuit disclosed in Japanese Patent Application Kokai Publication No. 2017-173008 is configured to pass noise components of not less than a predetermined frequency. If the plurality of branch breakers of the distribution board is provided with respective CR circuits, the processing for the frequency analysis is markedly reduced. However, whether the noise component detected by the CR circuit is high frequency noise has to be determined by a measuring mechanism and a determination mechanism. Accordingly, each branch breaker has to be provided with a CR circuit, a measuring mechanism, and a determination mechanism, respectively, and thus there is a problem of an increase in complexity of the configuration of the distribution board and also in costs for the distribution board.

<Determination of Abnormal Discharge Phenomenon>

When a power switch of an electrical appliance is opened or closed, a discharge phenomenon (switching noise), such as arc discharge, sometimes occurs. Switching noise is not an abnormal discharge phenomenon to break a breaker. The distribution board thus has to distinguish switching noise from an abnormal discharge phenomenon to break the breaker. The switching noise may be distinguished by frequency analysis. However, as described above, frequency analysis has a problem of complex processing. Simple processing is thus expected to distinguish switching noise from an abnormal discharge phenomenon to break the breaker.

<Specification of Source of Abnormal Discharge>

The plurality of branch breakers of the distribution board are provided in alignment in a direction. Accordingly, when a discharge phenomenon occurs in an electrical appliance connected to one branch breaker, high frequency noise from the single branch breaker interferes with another branch breaker. This causes a problem that high frequency noise is detected in a plurality of branch breakers and does not allow specifying the source of an abnormal discharge phenomenon.

<Object of Present Invention>

The present invention has been made in view of the above problems and it is an object thereof to provide a distribution board capable of detecting occurrence and a source of an abnormal discharge phenomenon by simple processing without complex frequency analysis.

Means to Solve the Problems (1) To achieve the above object, a distribution board of the present invention having a main breaker and a plurality of branch breakers, the distribution board being wired to branch power supplied to the main breaker into each branch breaker, the distribution board includes: a plurality of noise detection sections configured to correspond to the respective branch breakers one-to-one and each configured to output a detection signal based on a noise component of not less than a predetermined frequency generated on a secondary side of each branch breaker; and one processor configured to separately receive the detection signal output from each noise detection section and determine whether the detection signal is high frequency noise at a threshold or more.

(2) It is preferred that, in the distribution board according to (1) above, the plurality of noise detection sections configure one unit and each noise detection section of the unit is electrically connected to the respective branch breaker in a one-to-one correspondence.

(3) It is preferred that, in the distribution board according to (1) or (2) above, the processor specifies a source of the noise component based on, when the detection signals are received in a predetermined time, a magnitude of a signal level of each detection signal and/or a reception time of each detection signal.

(4) It is preferred that the distribution board according to any one of (1) through (3) above further includes a plurality of low-pass filters configured to be electrically connected to a primary side of the respective branch breakers or the respective noise detection sections to correspond to the respective branch breakers or the respective noise detection sections one-to-one and configured to break a noise component of not less than a predetermined frequency.

(5) It is preferred that, in the distribution board according to any one of (1) through (4) above, the processor outputs, when the detection signal is determined as the high frequency noise at a threshold or more, a control signal to the branch breaker corresponding to the noise detection section, one-to-one, having output the detection signal, thereby causing the branch breaker to be in a broken state.

(6) It is preferred that the distribution board according to any one of (1) through (5) above further includes a storage section capable of storing information, wherein the processor causes the storage section to store a result of processing based on reception of the detection signal and executes processing based on information stored in the storage section.

(7) It is preferred that the distribution board according to any one of (1) through (6) above further includes current detection sections configured to correspond to the respective noise detection sections one-to-one and each configured to detect a current on a secondary side of the respective noise detection section, wherein the processor determines, when the detection signal is determined as the high frequency noise at a threshold or more, whether an abnormal state occurs by comparing a first current detected before receiving the detection signal with a second current detected after receiving the detection signal.

(8) It is preferred that, in the distribution board according to (7) above, the processor determines that the abnormal state occurs when determining that there is no difference between the first current and the second current.

(9) It is preferred that, in the distribution board according to (7) above, the processor determines that the abnormal state does not occur when determining that there is a difference between the first current and the second current.

(10) It is preferred that the distribution board according to (1) above further includes: current detection sections configured to correspond to the respective noise detection sections one-to-one and each configured to detect a current on a secondary side of the respective noise detection sections; and a storage section capable of storing information, wherein in the storage section, past current waveform data measured based on a result detected by each current detection section, and the processor determines, when present current waveform data measured based on the result detected by each current detection section is different from the past current waveform data stored in the storage section, whether the detection signal output from the noise detection section is the high frequency noise at a threshold or more.

Effects of the Invention

The distribution board of the present invention allows detection of occurrence and a source of an abnormal discharge phenomenon by simple processing without complex frequency analysis.

BRIEF DESCRIPTION OF THE DRAWINGS

in FIG. 13.

MODES FOR CARRYING OUT THE INVENTION

<Distribution Board in First Embodiment>

A distribution board of the present invention in the first embodiment is described below with reference to FIGS. 1 through 7.

Figure 1:
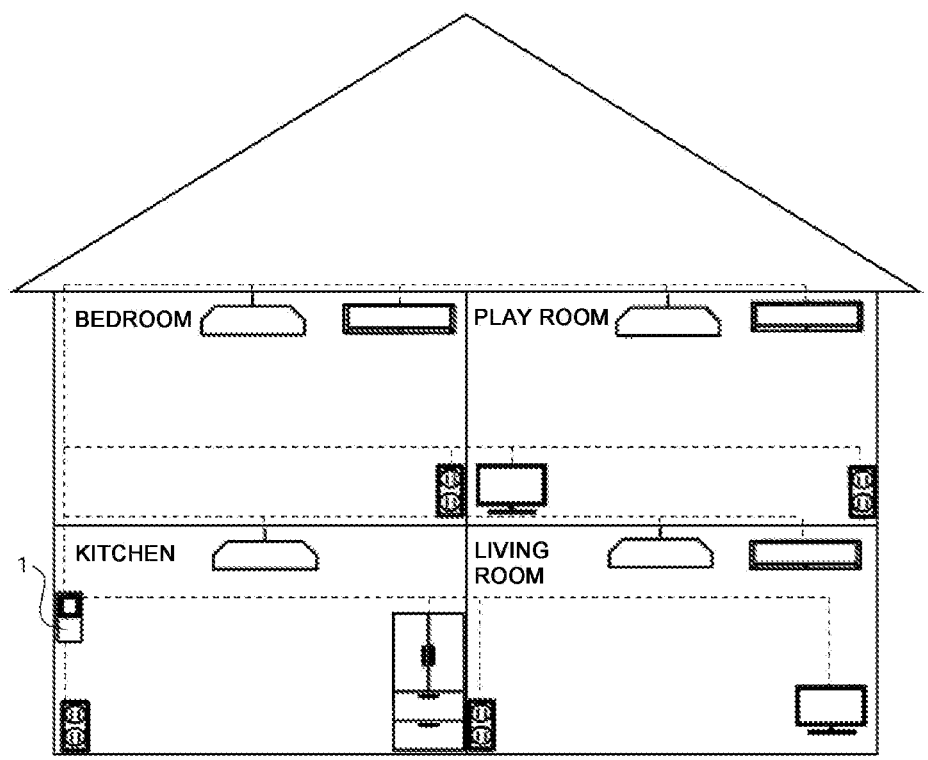
FIG. 1 is a schematic diagram illustrating a house where a distribution board according to an embodiment of the present invention is installed.

As illustrated in FIG. 1, a distribution board 1 in the present embodiment is installed in, for example, a regular house. The distribution board 1 distributes power supplied from a power company to a plurality of areas in a house. In FIG. 1, broken lines illustrate wiring to supply the power. The distribution board 1 is electrically connected to receptacles (plug sockets) for electrical appliances and lighting fixtures installed in respective rooms in the house. The receptacles are electrically connected to loads, such as lighting fixtures, refrigerators, air conditioners, and television sets. The distribution board 1 monitors the power supplied to the respective rooms in the house, and in a case of excessive consumption of power or current leakage, breaks all or part of power supply. In addition to such general functions, the distribution board 1 in the present embodiment is provided with a function of detecting a discharge phenomenon due to tracking and a short circuit.

Tracking means that a water content such as moisture is adhered to dust deposited between plugs put into a receptacle to cause energization between plugs. The dust deposited between the plugs repeatedly causes spark discharge. An insulating resin carbonized by the spark discharge forms a conductive pathway (track). The energization between the plugs ignites the insulating resin of the receptacle and the plugs to cause a fire.

Figure 2:
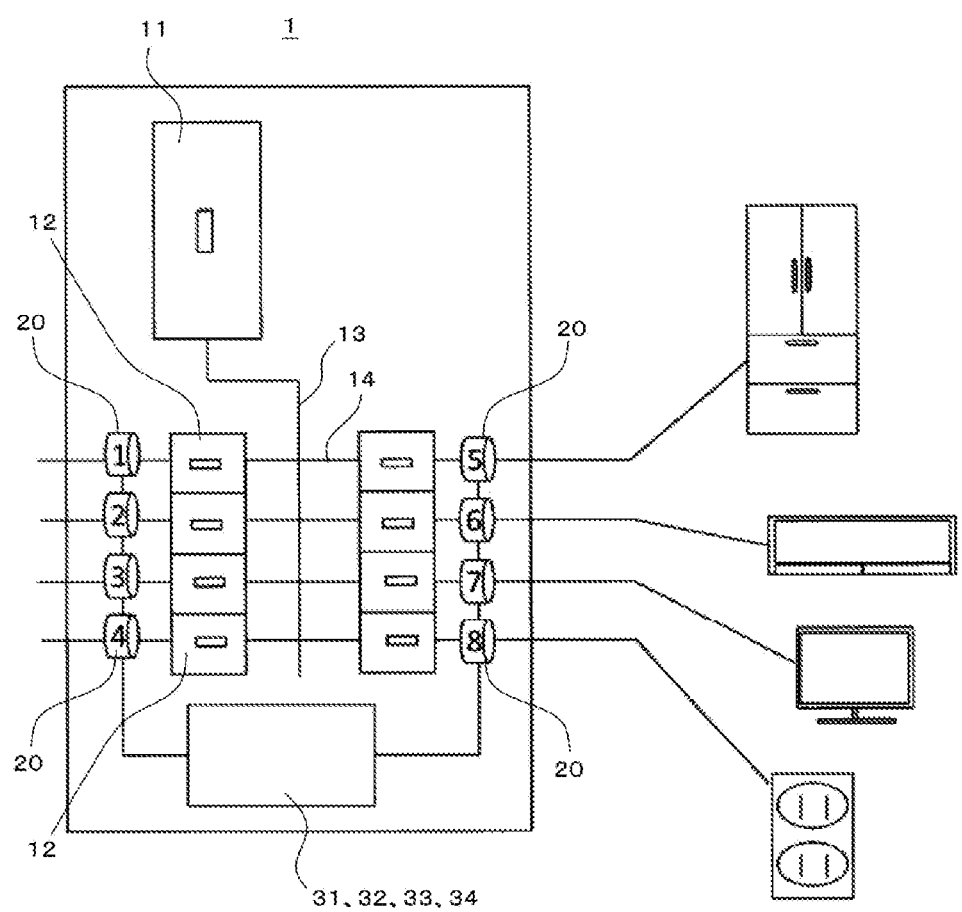
FIG. 2 is a schematic diagram illustrating a distribution board of the present invention in a first embodiment.
Figure 3:
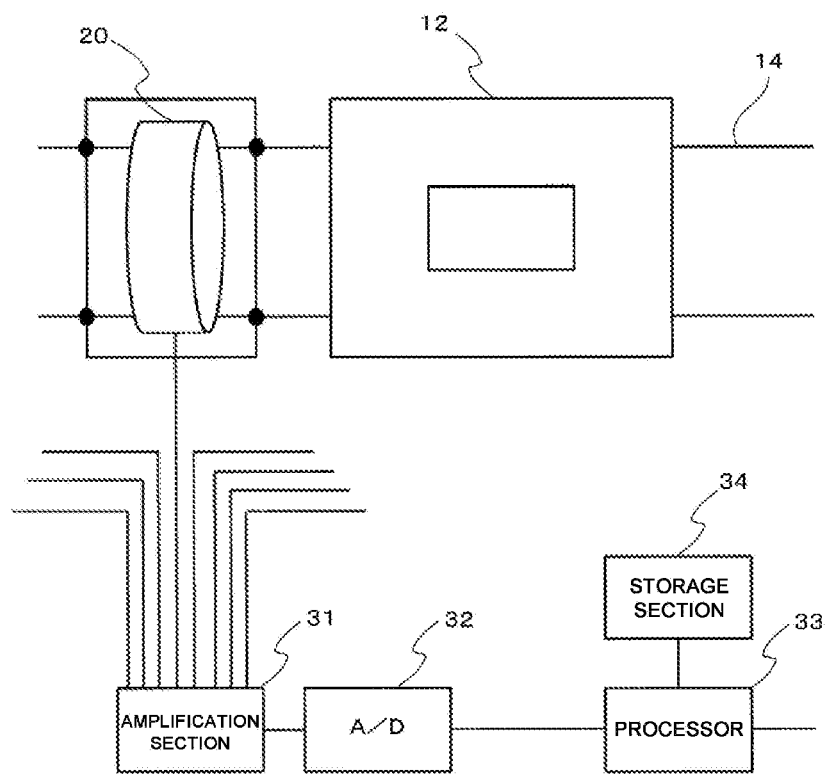
FIG. 3 is a block diagram illustrating a discharge phenomenon detection structure of the distribution board in FIG. 2.

FIG. 2 illustrates the entire configuration of the distribution board 1. FIG. 3 illustrates a discharge phenomenon detection structure of the distribution board 1. In FIGS. 2 and 3, the distribution board 1 includes a main breaker 11, eight branch breakers 12, eight noise detection sections 20, an amplification section 31, an A/D converter 32, a processor 33, and a storage section 34. Among them, the discharge phenomenon detection structure is configured with the eight noise detection sections 20, the amplification section 31, the A/D converter 32, the processor 33, and the storage section 34.

In FIG. 2, the power from a power company is supplied to a primary side of the main breaker 11 through outdoor wiring. A secondary side of the main breaker 11 is electrically connected to a bus bar 13. Primary sides of the respective eight branch breakers 12 are electrically connected to the bus bar 13 via wiring 14. Secondary sides of the respective eight branch breakers 12 are electrically connected to receptacles and loads illustrated in FIG. 1 via the wiring 14. The eight noise detection sections 20 are electrically connected to the middle of the wiring 14 on the secondary sides of the respective branch breakers 12 in a one-to-one correspondence. Each noise detection section 20 detects a noise component of not less than a predetermined frequency generated on the secondary side of the branch breaker 12 in a one-to-one correspondence and outputs a detection signal (analog signal).

In FIG. 2, reference numbers from "1" to "8" are given to the eight noise detection sections 20. In accordance with the reference numbers, the eight noise detection sections 20 may be referred to as the "first noise detection section 20" through the "eighth noise detection section 20" to distinguish them.

In FIG. 3, each noise detection section 20 is electrically connected to the amplification section 31. The amplification section 31 amplifies the detection signal output from each noise detection section 20. The amplification section 31 is electrically connected to the A/D converter 32. The A/D converter 32 converts the detection signal amplified by the amplification section 31 to a digital signal. The A/D converter 32 is electrically connected to the processor 33. The processor 33 compares the detection signal converted to a digital signal by the A/D converter 32 with a threshold and determines whether the noise component detected by the noise detection section 20 is high frequency noise. The processor 33 executes various types of processing described later. The processor 33 is electrically connected to a breaking section 12*a* (refer to FIGS. 4 and 5) of each branch breaker 12 and to an alarm device and a display that are not shown. The processor 33 is capable of sending and receiving data to and from the storage section 34. The storage section 34 is configured with, for example, a ROM (read only memory) and a RAM (random access memory). The ROM stores a program to cause the processor 33 to execute processing and information used for the processing by the processor 33. The RAM stores temporary data, such as calculation results by the processor 33.

As illustrated in FIG. 3, the wiring 14 electrically connecting the amplification section 31 with the A/D converter 32 is preferably as short as possible. Since the detection signal amplified by the amplification section 31 is an analog signal, it is likely to be affected by noise generated in another electrical appliance while passing through the wiring 14. A shorter length of the wiring 14 between the amplification section 31 and the A/D converter 32 allows the detection signal to be converted to a digital signal without affected by the noise. Digital signals are less likely to be affected by noise compared with analog signals.

It should be noted that, although not shown, the processor 33 is capable of distinguishing the eight detection signals from different sources using, for example, time division multiplexing or bus wiring. The processor 33 may distinguish the eight detection signals by dedicated paths. That is, by electrically connecting the amplification section 31 and the A/D converter 32 to the respective eight noise detection sections 20, eight dedicated paths for the detection signal output from each noise detection section 20 are formed. The respective dedicated paths are electrically connected to eight input terminals of the processor 33.

<<Discharge Phenomenon Detection Structure in First Embodiment>>

Figure 4:
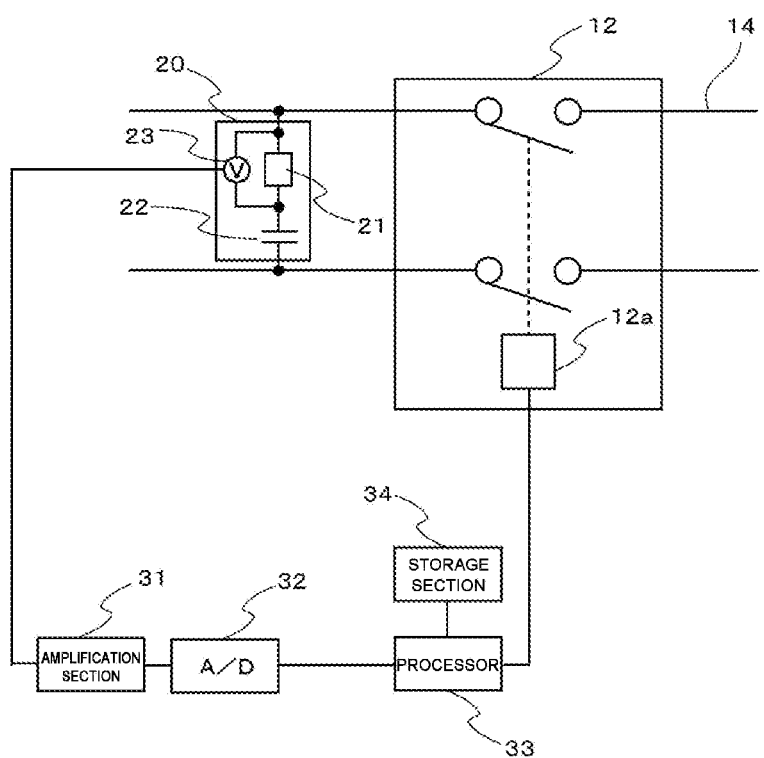
FIG. 4 is a block diagram illustrating the discharge phenomenon detection structure in a first embodiment.

FIG. 4 illustrates the discharge phenomenon detection structure in the first embodiment. In FIG. 4, the noise detection section 20 is a high-pass filter configured with a resistor 21, a capacitor 22, and a detection section 23. The resistor 21 and the capacitor 22 are electrically connected to the positive and negative wiring 14 on the secondary side of the branch breaker 12. The capacitor 22 feeds a current in a case of a high frequency in an alternating current circuit and does not feed a current in a case of a low frequency. When the current flows in the capacitor 22, the detection section 23 detects voltages at both ends of the resistor 21. Use of the frequency characteristics of the capacitor 22 thus allows detection of noise components of not less than a predetermined frequency.

Figure 6:
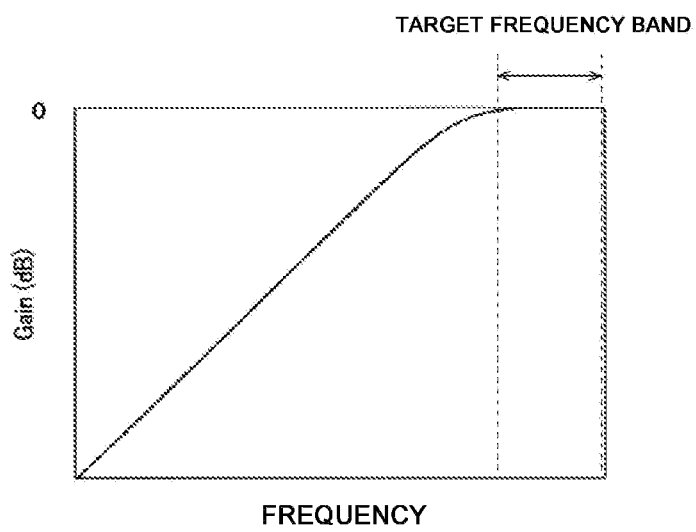
FIG. 6 is a graph illustrating frequency characteristics of a noise detection section.

FIG. 6 illustrates such frequency characteristics of the noise detection sections 20. The capacitor 22 feeds a current in a target frequency band in FIG. 6. At this point, the detection section 23 outputs a detection signal in accordance with voltage levels at both ends of the resistor 21. The detectable range of the noise detection section 20 is determined by the target frequency band. The target frequency band is preferably higher than the frequency band of "conduction noise" generated in normally operating home appliances. For example, the target frequency band is preferably in a frequency band of "radiation noise" exceeding the frequency band of the "conduction noise".

<<Discharge Phenomenon Detection Structure in Second Embodiment>>

Figure 5:
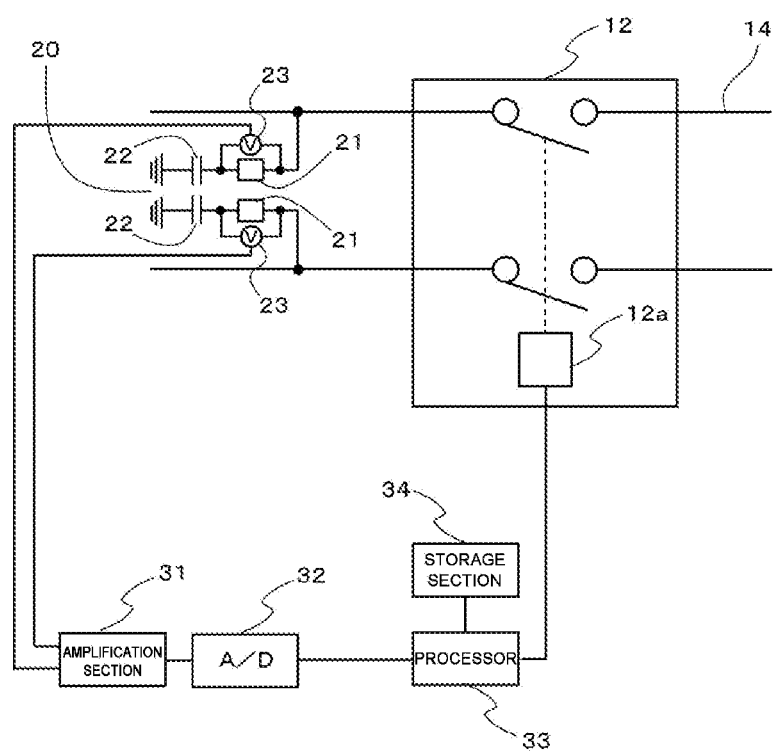
FIG. 5 is a block diagram illustrating the discharge phenomenon detection structure in a second embodiment.

FIG. 5 illustrates the discharge phenomenon detection structure in the second embodiment. The noise detection section 20 may be configured with a pair of high-pass filters. That is, the respective positive and negative wiring 14 on the secondary side of the branch breaker 12 is provided with each high-pass filter having the resistor 21, the capacitor 22, and the detection section 23. The respective capacitors 22 of the pair of high-pass filters are electrically connected to a grounding terminal.

<<Discharge Phenomenon Detection Structure in Third Embodiment>>

Figure 7:
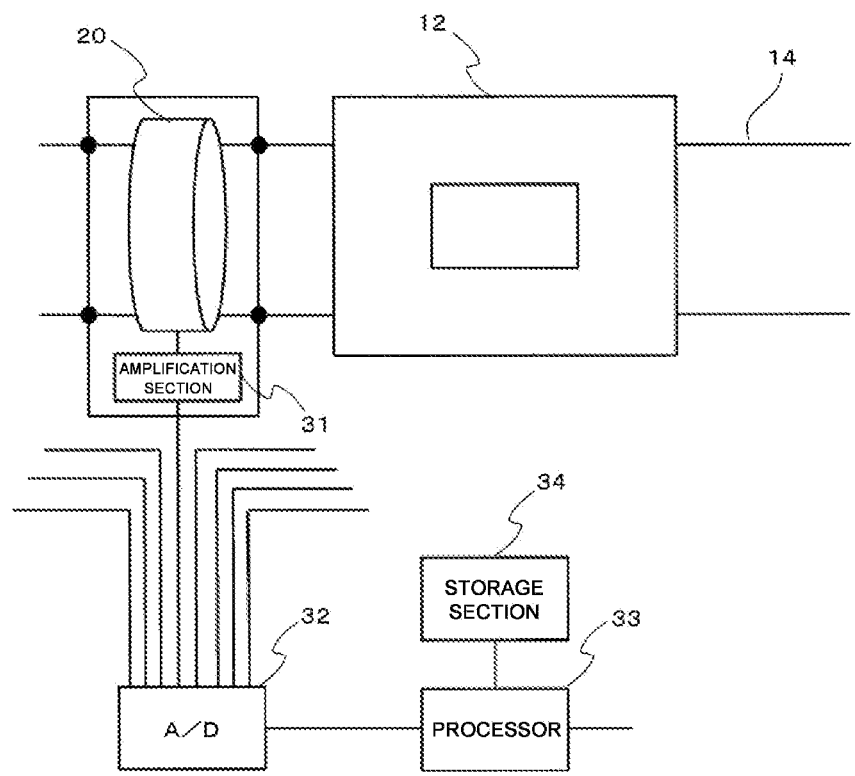
FIG. 7 is a block diagram illustrating the discharge phenomenon detection structure in a third embodiment.

FIG. 7 illustrates the discharge phenomenon detection structure in the third embodiment. The amplification section 31 may be built in, for example, a high-pass filter circuit configuring the noise detection section 20. In this case, eight amplification sections 31 are electrically connected to the respective eight noise detection sections 20 in a one-to-one correspondence. As described earlier, the wiring 14 electrically connecting the respective eight amplification sections 31 to the A/D converter 32 is preferably as short as possible.

<Distribution Board in Second Embodiment>

The distribution board of the present invention in the second embodiment is then described with reference to FIGS. 8 and 9. It should be noted that an identical reference sign is given to the configuration in the second embodiment below same as that in the first embodiment described above to omit a detailed description.

Figure 8:
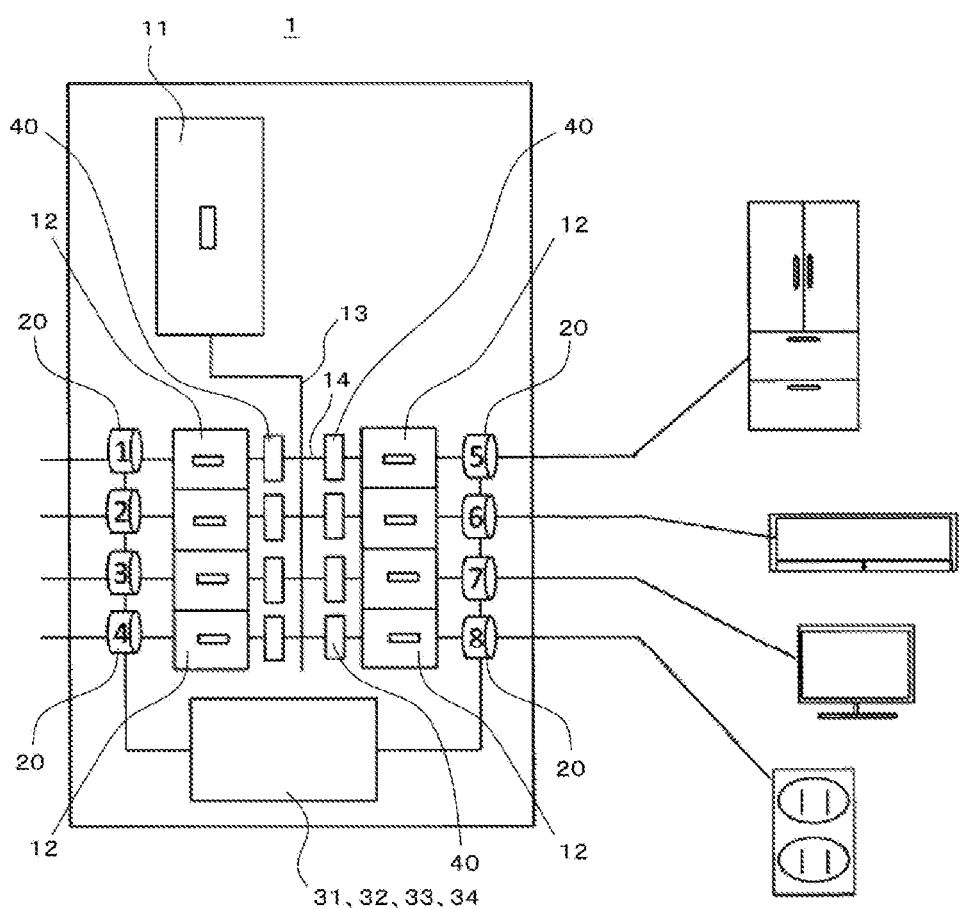
FIG. 8 is a schematic diagram illustrating a distribution board of the present invention in a second embodiment.
Figure 9:
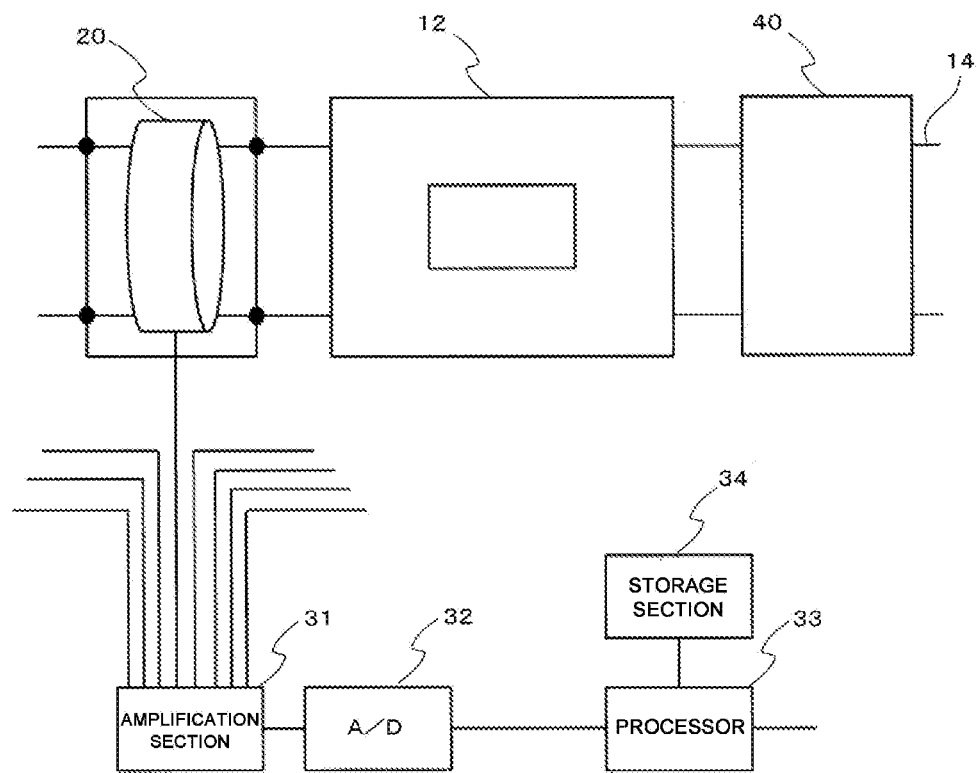
FIG. 9 is a block diagram illustrating a discharge phenomenon detection structure of the distribution board in FIG. 8.

As illustrated in FIGS. 8 and 9, the distribution board 1 in the present embodiment includes eight low-pass filters 40 to break noise components of not less than a predetermined frequency. The respective low-pass filters 40 are electrically connected to the primary side of the eight branch breakers 12 to correspond to the respective branch breakers 12 one-to-one. Each low-pass filter 40 prevents interference from high frequency noise generated by a discharge phenomenon.

Figure 15A:
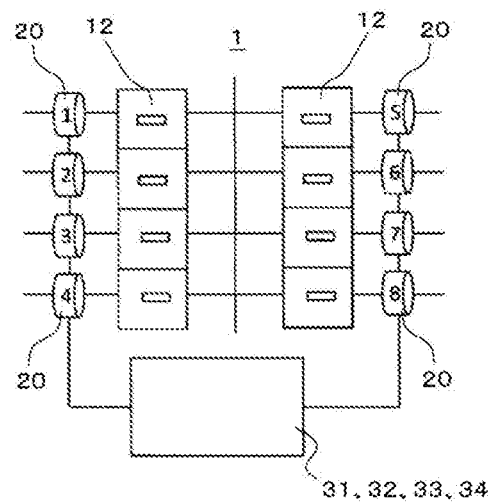
FIG. 15A is a schematic diagram illustrating the discharge phenomenon detection structure of the distribution board according to the first embodiment.
Figure 15B:
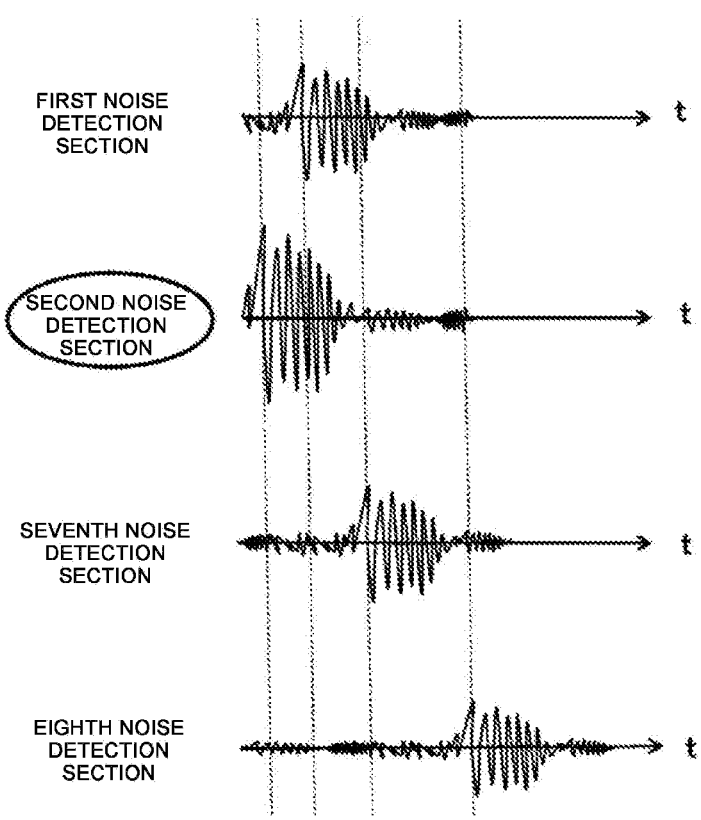
FIG. 15B illustrates a plurality of noise waveforms detected by the discharge phenomenon detection structure.

A description is given here to interference from the high frequency noise. FIG. 15A is a schematic diagram illustrating a discharge phenomenon detection structure of the distribution board according to the first embodiment. FIG. 15B illustrates a plurality of noise waveforms detected by the discharge phenomenon detection structure.

The distribution board 1 in FIG. 15A does not include the low-pass filters 40 in FIG. 8. Accordingly, when a discharge phenomenon occurs in an electrical appliance connected to one of the branch breakers 12, high frequency noise from the single branch breaker 12 interferes with other branch breakers 12. The noise waveforms in FIG. 15B exemplify the interference from the high frequency noise. FIG. 15B illustrates a case of a discharge phenomenon occurred in an electrical appliance connected to one branch breaker 12 corresponding to the second noise detection section 20 one-to-one. In this case, the second noise detection section 20 detects a noise component of the greatest signal level at the earliest timing. This noise component propagates from the primary side of the one branch breaker 12 to the primary sides of the other branch breakers 12 and is detected by the first and third through eighth noise detection sections 20.

In FIGS. 15A and 15B, the branch breaker 12 to be broken is only the branch breaker 12 corresponding to the second noise detection section 20 one-to-one. However, the first and third through eighth noise detection sections 20 also detect the noise components. If the noise components detected by the first and third through eighth noise detection sections 20 have a signal level at the threshold or more, the processor 33 turns out to break the other branch breakers 12 irrelevant to the discharge phenomenon.

Such a problem of the interference from the high frequency noise is solved by the eight low-pass filters 40 illustrated in FIG. 8. The respective low-pass filters 40 break the noise components of not less than a predetermined frequency detected by the corresponding noise detection section 20. This allows prevention of propagation of the noise component to the other branch breakers 12 irrelevant to the discharge phenomenon. As a result, the processor 33 is capable of specifying and breaking the single branch breaker 12 electrically connected to the source of the discharge phenomenon.

<Distribution Board in Third Embodiment>

The distribution board of the present invention in the third embodiment is then described with reference to FIGS. 10 and 11. It should be noted that an identical reference sign is given to the configuration in the third embodiment below same as that in the first and second embodiments described above to omit a detailed description.

Figure 10:
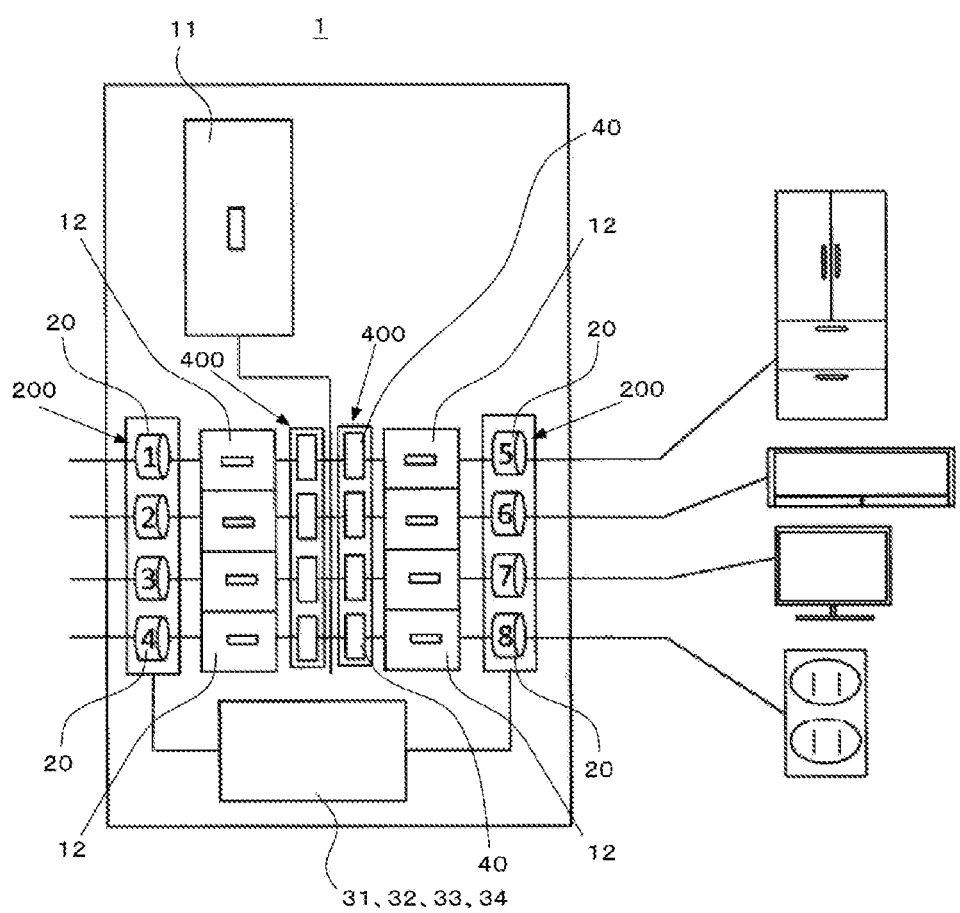
FIG. 10 is a schematic diagram illustrating a distribution board of the present invention in a third embodiment.
Figure 11:
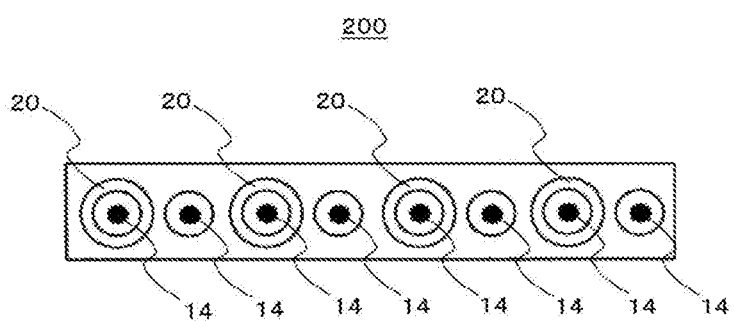
FIG. 11 is a schematic diagram illustrating a noise detection unit of the distribution board in FIG. 10.

As illustrated in FIG. 10, the distribution board 1 in the present embodiment includes two noise detection section units 200 and two low-pass filter units 400. Each noise detection section unit 200 is configured with four noise detection sections 20. As illustrated in FIG. 11, the four noise detection sections 20 configuring the noise detection section unit 200 are electrically connected to positive and negative wiring 14 on the secondary sides of the branch breakers 12. Each noise detection section 20 is connected to the respective wiring 14 by a connector, not shown. This facilitates the operation of connecting the plurality of noise detection sections 20 to the distribution board 1.

As illustrated in FIG. 10, each low-pass filter unit 400 is also configured with the four low-pass filters 40. The four low-pass filters 40 configuring the low-pass filter unit 400 are electrically connected to the positive and negative wiring 14 on the primary sides of the branch breakers 12. Each low-pass filter 40 is connected to the respective wiring 14 by a connector, not shown. This facilitates the operation of connecting the plurality of low-pass filters 40 to the distribution board 1.

<Distribution Board in Fourth Embodiment>

The distribution board of the present invention in the fourth is then described with reference to FIG. 12. It should be noted that an identical reference sign is given to the configuration in the fourth embodiment below same as that in the first and second embodiments described above to omit a detailed description.

Figure 12:
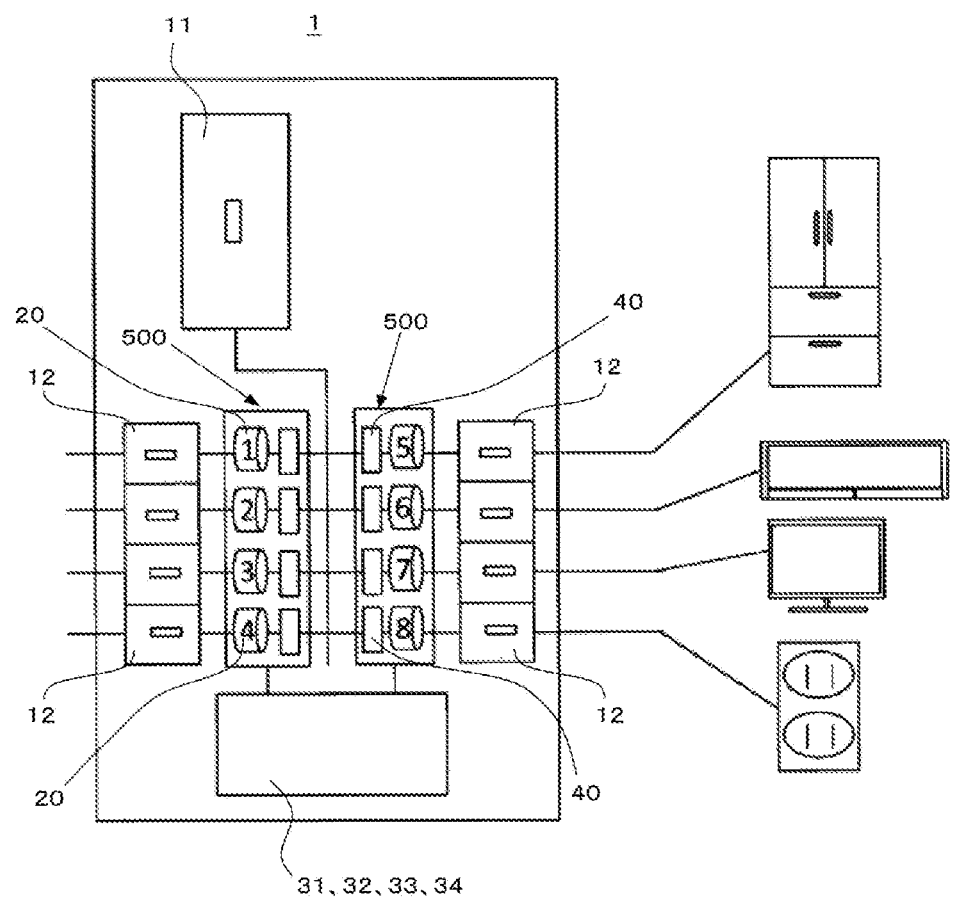
FIG. 12 is a schematic diagram illustrating a distribution board of the present invention in a fourth embodiment.

As illustrated in FIG. 12, the switchboard 1 in the present embodiment includes two combined units 500. Each combined unit 500 is configured with the four noise detection sections 20 and the four low-pass filters 40. The noise detection sections 20 are electrically connected to the positive and negative wiring 14 on the primary sides of the branch breakers 12. The low-pass filters 40 are electrically connected to the positive and negative wiring 14 on primary sides of the noise detection sections 20. It should be noted that the numbers of the noise detection sections 20 and the low-pass filters 40 to be combined are not particularly limited. For example, each combined unit 500 may be configured with one noise detection section 20 and one low-pass filter 40. The combination of the noise detection sections 20 and the low-pass filters 40 more facilitates the operation of connection to the switchboard 1.

<Distribution Board in Fifth Embodiment>

The distribution board of the present invention in the fifth embodiment is then described with reference to FIGS. 13 and 14. It should be noted that an identical reference sign is given to the configuration in the fifth embodiment below same as that in the first through third embodiments described above to omit a detailed description.

Figure 13:
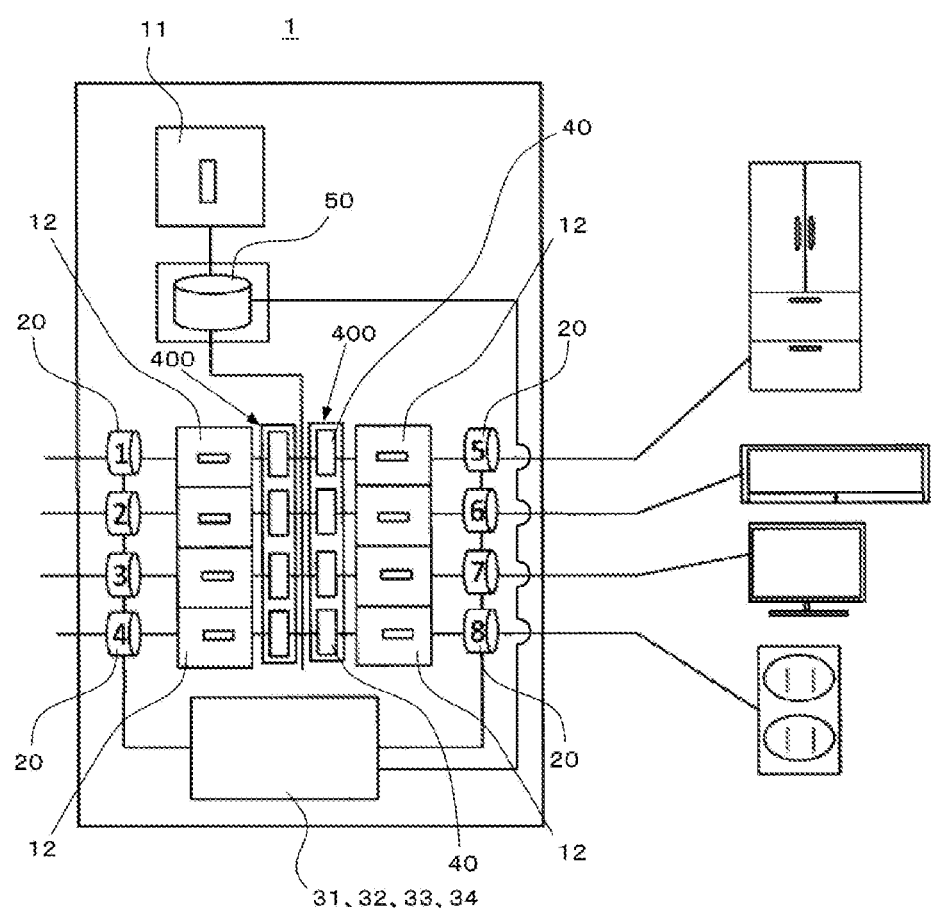
FIG. 13 is a schematic diagram illustrating a distribution board of the present invention in a fifth embodiment.

As illustrated in FIG. 13, the distribution board 1 in the present embodiment includes a main noise detection section 50. The main noise detection section 50 is electrically connected to the middle of the wiring 14 on the secondary side of the main breaker 11. The main noise detection section 50 detects a noise component of not less than a predetermined frequency generated on the primary side of the main breaker 11 and outputs a detection signal (analog signal).

Figure 14:
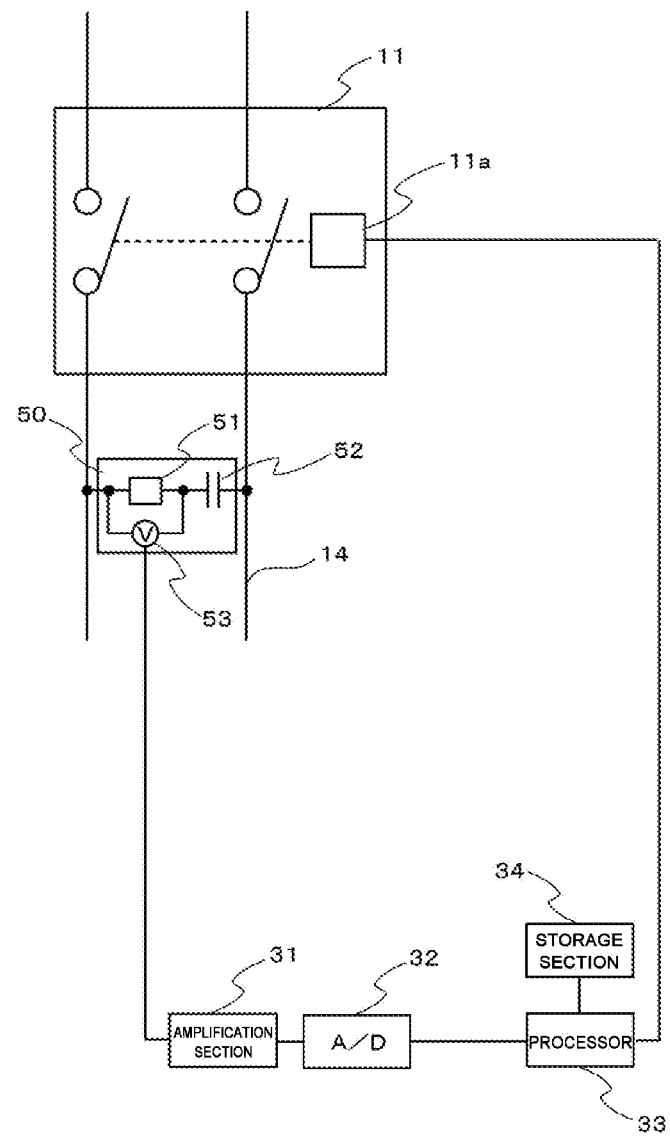
FIG. 14 is a block diagram illustrating a second discharge phenomenon detection structure of the distribution board in FIG.

As illustrated in FIG. 14, the main noise detection section 50 is a high-pass filter configured with a resistor 51, a capacitor 52, and a detection section 53. The resistor 51 and the capacitor 52 are electrically connected to the positive and negative wiring 14 on the secondary side of the main breaker 11. The capacitor 52 feeds a current in a case of a high frequency in the alternating current circuit and does not feed a current in a case of a low frequency. When the current flows in the capacitor 52, the detection section 53 detects voltages at both ends of the resistor 51. Use of the frequency characteristics of the capacitor 52 thus allows detection of noise components of not less than a predetermined frequency.

The main noise detection section 50 (detection section 53) is electrically connected to the amplification section 31. The amplification section 31 amplifies the detection signal output from the main noise detection section 50. The amplification section 31 is electrically connected to the A/D converter 32. The A/D converter 32 converts the detection signal amplified by the amplification section 31 to a digital signal. The A/D converter 32 is electrically connected to the processor 33. The processor 33 is electrically connected to a breaking section 11a of the main breaker 11.

The processor 33 compares the detection signal converted to a digital signal by the A/D converter 32 with a threshold and determines whether the noise component detected by the main noise detection section 50 is high frequency noise. The processor 33 outputs, when determining as the high frequency noise, a control signal. The control signal is input to the breaking section 11a of the main breaker 11. The breaking section 11a causes the main breaker 11 to be in a broken state based on the control signal.

Such a main noise detection section 50 allows detection of a discharge phenomenon occurred on the primary side of the main breaker 11, thereby causing the main breaker 11 to be in a broken state.

<Processing by Processor in First Embodiment>

The processing by the processor 33 in the first embodiment is described below referring to FIGS. 15A and 15B. As described earlier, the distribution board 1 in FIG. 15A does not include the low-pass filters 40 in FIG. 8. Accordingly, when a discharge phenomenon occurs in an electrical appliance connected to one of the branch breakers 12, high frequency noise from the single branch breaker 12 interferes with other branch breakers 12. As a result, the respective first through eighth noise detection sections 20 detect a plurality of detection signals as illustrated in FIG. 15B.

In this case, the processor 33 determines a source of the noise component. That is, the plurality of detection signals illustrated in FIG. 15B are amplified by the amplification section 31 and converted to digital signals by the A/D converter 32, followed by input to the processor 33. When the detection signals are received in a predetermined time, the processor 33 detects high frequency noise at a threshold or more by comparing the signal level of each detection signal with the threshold. When the high frequency noise is detected in one of the noise detection sections 20, the processor 33 determines the noise detection section 20 having output the high frequency noise as the source.

In contrast, when the high frequency noise is detected in a plurality of the noise detection sections 20, the processor 33 compares each signal level of the high frequency noise and also compares each reception time of the high frequency noise. As a result, the processor 33 specifies the high frequency noise of the greatest signal level and the high frequency noise received at the earliest timing. When these comparisons specify the high frequency noise from one noise detection section 20, the processor 33 determines the single noise detection section 20 having output the high frequency noise as the source. For example, in a specific example in FIG. 15B, the second noise detection section 20 is determined as the source.

Meanwhile, when the high frequency noise of the greatest signal level is specified in one noise detection section 20 and the high frequency noise received at the earliest timing is specified in another noise detection section 20, the processor 33 determines these two noise detection sections 20 having output the high frequency noise as the sources.

It should be noted that the processor 33 may determine either one of each signal level and each reception time of the high frequency noise. In this case, the processor 33 determines one noise detection section 20 as the source every time.

The discharge phenomenon detection structure of the distribution board 1 in FIG. 15A has a configuration in which detection signals output from the plurality of noise detection sections 20 are processed by the single processor 33. This configuration allows comparison of the plurality of detection signals, and as a result, the processing in the first embodiment described above is achieved. The processing in the first embodiment described above allows omission of the plurality of low-pass filters 40 illustrated in FIG. 8, and thus allows reduction in costs, size, and installation space of the distribution board 1.

<Processing by Processor in Second Embodiment>

Figure 16A:
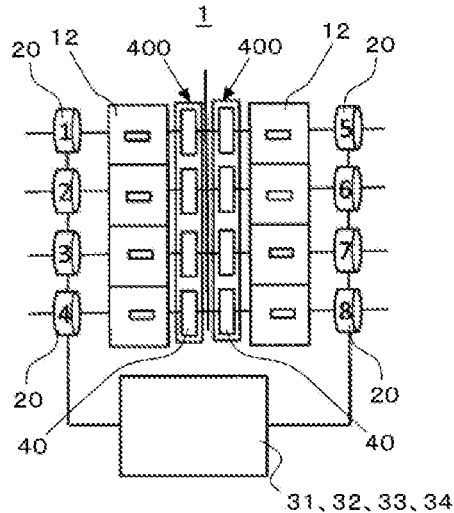
FIG. 16A is a schematic diagram illustrating the discharge phenomenon detection structure of the distribution board according to the third embodiment.

The processing by the processor 33 in the second embodiment is described below referring to FIGS. 16A and 16B. A result of processing by the processor 33 may be stored in the storage section 34. The processor 33 is capable of causing the storage section 34 to store, for example, information on time and date of detecting a discharge phenomenon (high frequency noise). The processor 33 is also capable of executing processing to sound an alarm or break the branch breaker 12 based on information on time and date of detecting the discharge phenomenon stored in the storage section 34.

A specific description is given below. The distribution board 1 in FIG. 16A includes the low-pass filters 40 in FIG. 8. The distribution board 1 thus does not cause the interference from high frequency noise described above. The processor 33 of the distribution board 1 is capable of specifying one noise detection section 20 as the source of the high frequency noise without executing processing in the first embodiment described above.

Figure 16B:
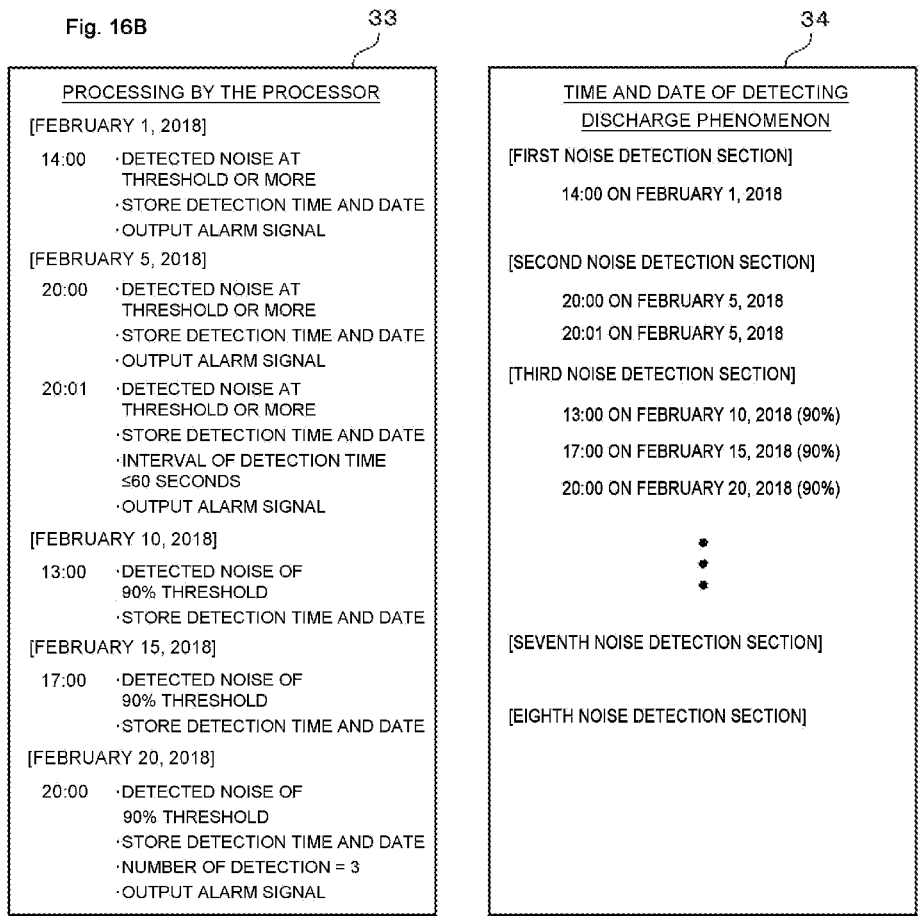
FIG. 16B is a chart illustrating processing by a processor included in the discharge phenomenon detection structure and information stored in a storage section.

The processor 33 executes processing indicated by a reference sign 33 in FIG. 16B causes the storage section 34 to store information indicated by a reference sign 34. The following description is given to the processing by the processor 33 for five days of "Feb. 1, 2018", "Feb. 5, 2018", "Feb. 10, 2018", "Feb. 15, 2018", and "Feb. 20, 2018" and the information stored in the storage section 34.

<<Feb. 1, 2018>>

At 14:00, the processor 33 determines that the detection signal output from the first noise detection section 20 is the high frequency noise at the threshold or more (step S1). The processor 33 then causes the storage section 34 to store time and date of detecting the discharge phenomenon (high frequency noise) (step S2). The processor 33 then outputs a control signal to sound an alarm (step S3). Based on the control signal, a speaker, not shown, sounds an alarm. As a result, occurrence of the discharge phenomenon is notified to a user by a sound.

Steps S1 through S3 above are standard processing when the processor 33 detects high frequency noise.

<<Feb. 5, 2018>>

At 20:00, the processor 33 determines that the detection signal output from the second noise detection section 20 is the high frequency noise at the threshold or more (step S1). The processor 33 then causes the storage section 34 to store time and date of detecting the discharge phenomenon (high frequency noise) (step S2). The processor 33 then outputs a control signal to sound an alarm (step S3). Based on the control signal, a speaker, not shown, sounds an alarm. As a result, occurrence of the discharge phenomenon is notified to a user by a sound.

Same as above, steps S1 through S3 are standard processing when the processor 33 detects high frequency noise.

However, at 20:01, the processor 33 determines again that the detection signal output from the second noise detection section 20 is the high frequency noise at the threshold or more (step S1). The processor 33 then causes the storage section 34 to store time and date of detecting the discharge phenomenon (high frequency noise) (step S2). The processor 33 then refers to "20:00 on Feb. 5, 2018" and "20:01 on Feb. 5, 2018" stored in the storage section 34 and determines whether the time interval of detecting the discharge phenomena is 60 seconds or less (step S4). When determining as 60 seconds or less, the processor 33 outputs a control signal to break the branch breaker 12 electrically connected to the second noise detection section 20 (step S5).

Step S4 described above is processing to determine the frequency of discharge phenomena. When two or more discharge phenomena are detected within 60 seconds, there is a possibility of tracking and a short circuit. The processor 33 thus immediately breaks the branch breaker 12 electrically connected to the source of the discharge phenomena.

<<Feb. 10, 2018>>

At 13:00, the processor 33 determines that a detection signal output from the third noise detection section 20 as noise reaching 90% of the threshold (step S6). The processor 33 then causes the storage section 34 to store time and date of detecting the noise and information indicating that the noise thus detected reaches 90% of the threshold (step S7).

Noise of less than the threshold does not indicate occurrence of an abnormal discharge phenomenon. The processor 33 thus executes neither processing to sound an alarm (step S3) nor processing to break the branch breaker 12 (step S5).

<<Feb. 15, 2018>>

At 17:00, the processor 33 determines that the detection signal output from the third noise detection section 20 is the noise reaching 90% of the threshold (step S6). The processor 33 then causes the storage section 34 to store time and date of detecting the noise and information indicating that the noise thus detected reaches 90% of the threshold (step S7).

Same as above, the noise of less than the threshold does not indicate occurrence of an abnormal discharge phenomenon. In addition, the time interval of detecting the discharge phenomena reaching 90% of the threshold of as much as five days has passed since the last time on Feb. 10, 2018.

<<Feb. 20, 2018>>

At 20:00, the processor 33 determines that the detection signal output from the third noise detection section 20 is the noise reaching 90% of the threshold (step S6). The processor 33 then causes the storage section 34 to store time and date of detecting the noise and information indicating that the noise thus detected reaches 90% of the threshold (step S7). The processor 33 then refers to "13:00 (90%) on Feb. 10, 2018", "17:00 (90%) on Feb. 15, 2018", and "20:00 (90%) on Feb. 20, 2018" stored in the storage section 34 and determines that the number of detecting the noise reaching 90% of the threshold in the third noise detection section 20 is "3" (step S8). As a result, the processor 33 outputs a control signal to sound an alarm (step S3). Based on the control signal, a speaker, not shown, sounds an alarm. As a result, occurrence of the discharge phenomenon is notified to a user by a sound.

The noise of less than the threshold does not indicate occurrence of an abnormal discharge phenomenon. However, detection of the noise reaching 90% of the threshold as much as three times from the same noise detection section 20 suggests occurrence of an abnormal state, such as tracking and a short circuit, in the future. The processor 33 thus executes processing to sound an alarm.

<<Change of Threshold>>

When the high frequency noise at the threshold or more is detected (step S1) or the noise reaching 90% of the threshold is detected (step S6), processing to lower the value of the threshold used for later determination may be executed. For example, steps S1 and S6 are executed at first using a first threshold. After that, when the high frequency noise at the threshold or more is detected or the noise reaching 90% of the threshold is detected, steps S1 and S6 are executed using a second threshold of a value less than the first threshold. Such processing allows prevention of tracking, a short circuit, and the like before occurring. That is, a discharge phenomenon causes degradation of wiring of electrical appliances and indoor wiring. The degraded wiring has a risk of causing an abnormal state, such as tracking and a short circuit, even by a low discharge phenomenon less than the threshold. Accordingly, stepwise reduction of the threshold based on detection of a discharge phenomenon allows more accurate determination considering the degradation of wiring.

<Processing by Processor in Third Embodiment>

The processing by the processor 33 in the third embodiment is described below referring to FIG. 17. As described earlier, the storage section 34 stores the information obtained through processing by the processor 33. In addition, the storage section 34 stores information that a user may optionally register. Meanwhile, based on the detection of the discharge phenomenon, the processor 33 executes processing to cause the detection result to be displayed on the display. In the present processing, the processor 33 generates message data indicating the substance of the detection result by combining the plurality of information items stored in the storage section 34. A specific description is given below.

Figure 17:
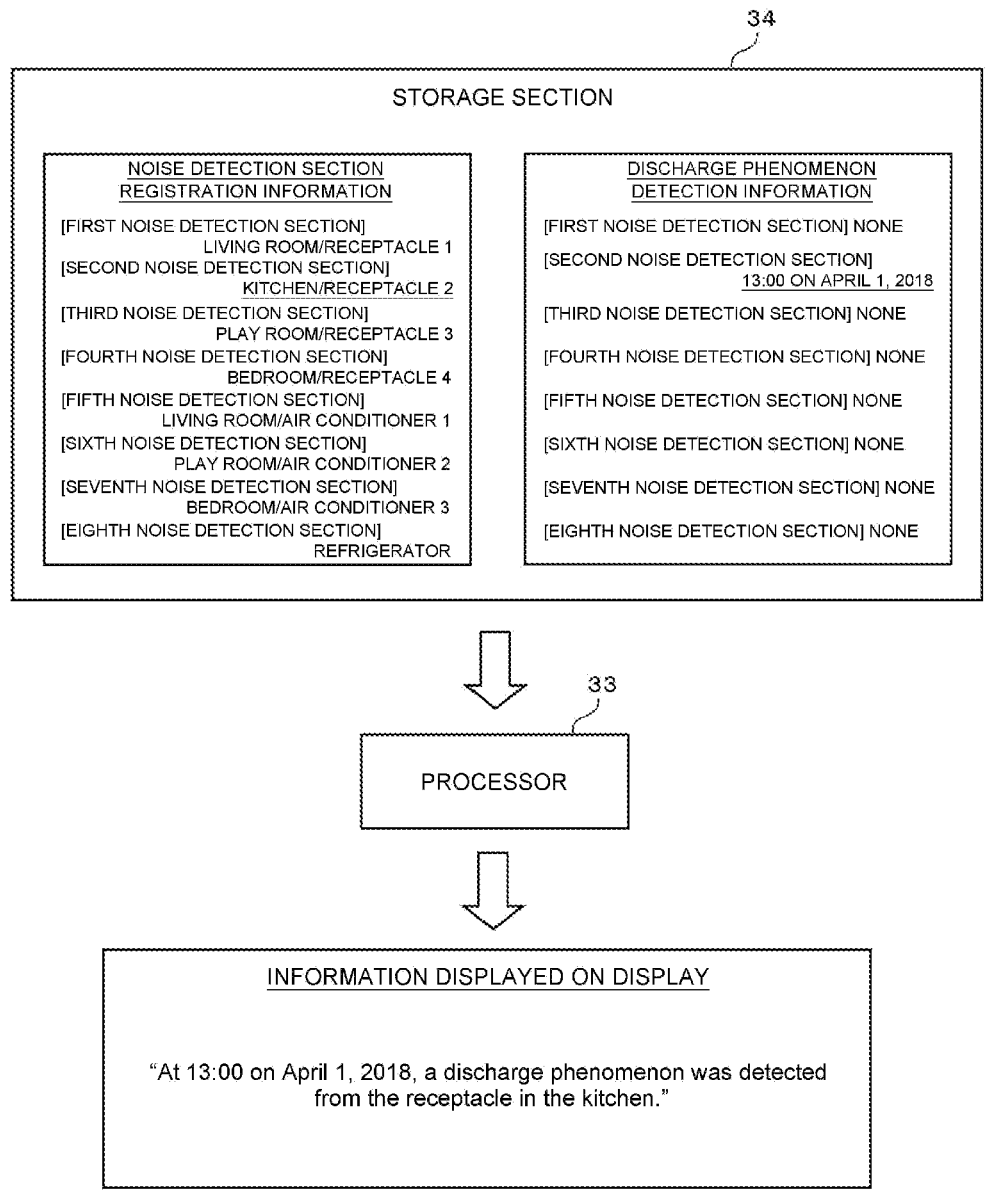
FIG. 17 is a chart illustrating information stored in the storage section and information displayed on a display.

The reference sign 34 in FIG. 17 indicates a specific example the information stored in the storage section 34. In FIG. 17, "Noise Detection Section Registration Information" is an example of the information that a user may optionally register. Meanwhile, "Discharge Phenomenon Detection Information" is information on the time and date of detecting the discharge phenomenon obtained through processing by the processor 33.

The "Noise Detection Section Registration Information" includes information on equipment names and installation locations of receptacles or loads electrically connected to the receptacles. The information on the equipment names and the installation locations is associated with the information on the "first through eighth noise detection sections". The title of the equipment names and the installation locations may be arbitrarily registered by a user. A user may register one of the information on the equipment names and the installation locations or may register neither of them.

The "Discharge Phenomenon Detection Information" includes information on the time and date of detecting the discharge phenomenon detected by the processor 33. The information on the time and date of detecting the discharge phenomenon is associated with the information on the "First through Eighth Noise Detection Sections".

The processor 33 generates message data indicating the substance of the detection result by combining the "Noise Detection Section Registration Information" and the "Discharge Phenomenon Detection Information" based on the detection of the discharge phenomenon. For example, at 13:00 on Apr. 1, 2018, the processor 33 determines that the detection signal output from the second noise detection section 20 is the high frequency noise (discharge phenomenon) at the threshold or more. The processor 33 then causes the storage section 34 to store the time and date of detecting the discharge phenomenon. The information "13:00 on Apr. 1, 2018" on the time and date of detecting the discharge phenomenon is stored in association with the information of the "Second Noise Detection Section" in the "Discharge Phenomenon Detection Information" of the storage section 34. The processor 33 then refers to the "Noise Detection Section Registration Information" and the "Discharge Phenomenon Detection Information" in the storage section 34. The processor 33 then generates message data based on each information piece of "Kitchen/Receptacle 2" and "13:00 on Apr. 1, 2018" associated with the information on the "Second Noise Detection Section" to cause a message of "At 13:00 on Apr. 1, 2018, a discharge phenomenon was detected from the receptacle in the kitchen." to be displayed on the display. Based on the message displayed on the display, a user is able to recognize the time and date, the location, the equipment name of the cause of the discharge phenomenon.

<Discharge Phenomenon Detection Structure in Fourth Embodiment>

The discharge phenomenon detection structure in the fourth embodiment is described below referring to FIGS. 18 and 19. It should be noted that an identical reference sign is given to the configuration in the fourth embodiment below same as that in the first embodiment illustrated in FIG. 4 to omit a detailed description.

As described earlier, when a power switch of an electrical appliance is opened or closed, a discharge phenomenon (switching noise), such as arc discharge, sometimes occurs. Switching noise is not an abnormal discharge phenomenon to break the branch breakers 12. The processor 33 thus has to distinguish switching noise from an abnormal discharge phenomenon to break the branch breakers 12.

Figure 18:
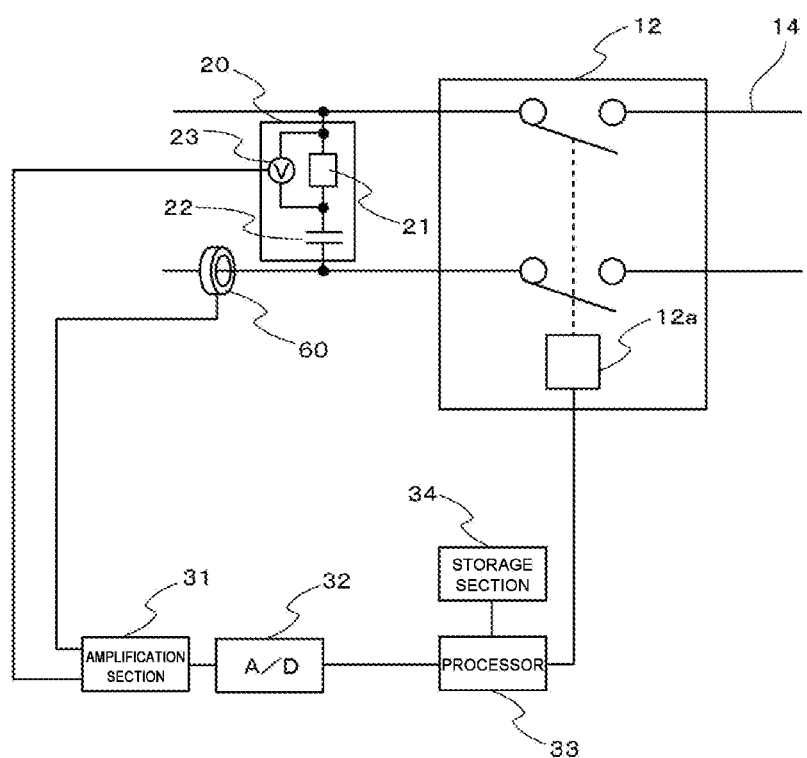
FIG. 18 is a block diagram illustrating a discharge phenomenon detection structure in a fourth embodiment.

As illustrated in FIG. 18, the discharge phenomenon detection structure in the fourth embodiment includes eight current detection sections 60 to distinguish the switching noise. Each current detection section 60 is, for example, a current transformer and has a configuration of winding a secondary winding on an annular core. Through the annular core, primary wiring subjected to the current measurement passes. The secondary winding feeds a secondary current in proportion to a primary current flowing in the primary wiring.

The eight current detection sections 60 are provided to correspond to the respective first through eighth noise detection sections 20 one-to-one. Through the annular core of each current detection section 60, wiring on a secondary side of each noise detection section 20 passes. Each current detection section 60 feeds the secondary current in proportion to the primary current flowing in wiring on the secondary side of each noise detection section 20. These secondary currents are amplified by the amplification section 31 to be converted to digital signals by the A/D converter 32. The digital signals output from the A/D converter 32 is input to the processor 33 to be used for processing by the processor 33.

The processor 33 determines, similar to the first embodiment illustrated in FIG. 4, whether the detection signal of each noise detection section 20 is the high frequency noise at the threshold or more. When the detection signal is determined as the high frequency noise at the threshold or more, the processor 33 in the present embodiment further refers to the secondary current of the corresponding current detection section 60 and determines whether the high frequency noise is due to an abnormal discharge phenomenon to brake the breaker 12.

Such processing of abnormal state determination by the processor 33 is described in detail with reference to FIG. 19. FIG. 19 illustrates the noise waveforms of the noise detection sections 20 and the current waveforms of the current detection sections 60. In FIG. 19, signs from (a) to (d) indicate timings of detecting the high frequency noise exceeding the threshold.

In FIG. 18, when a noise component of not less than the predetermined frequency is detected by the noise detection section 20, a current flows in the capacitor 22 of the noise detection section 20. Accordingly, as illustrated by (a) through (d) in FIG. 19, both the noise waveform and the current waveform are changed at the timings of detecting the high frequency noise.

Figure 19:
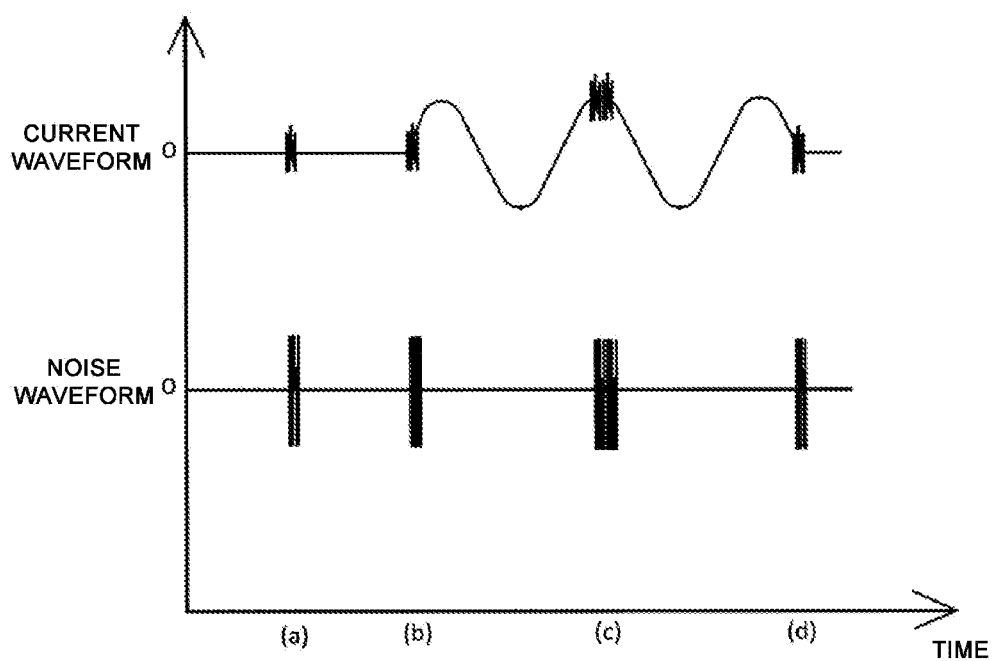
FIG. 19 is a chart illustrating a current waveform and a noise waveform detected by the discharge phenomenon detection structure.

At the timing (a) in FIG. 19, when the detection signal is determined as the high frequency noise at the threshold or more, the processor 33 calculates a difference between the values of the secondary current before and after the timing (a). According to the current waveform in FIG. 19, both values of the secondary current before and after the timing (a) are "0" and there is no difference between the two values of the secondary current. This means that, when the high frequency noise is generated, the electrical appliance electrically connected to the secondary side of the branch breaker 12 is in a turned off state. In other words, the high frequency noise detected at the timing (a) is not the switching noise of the electrical appliance. When determining that there is no difference between the values of the secondary current before and after the timing (a), the processor 33 outputs a control signal to sound an alarm or a control signal to break the branch breaker 12.

At the timing (b) in FIG. 19, when the detection signal is determined as the high frequency noise at the threshold or more, the processor 33 calculates a difference between the values of the secondary current before and after the timing (b). According to the current waveform in FIG. 19, the value of the secondary current before the timing (b) is "0" and the value of the secondary current after the timing (b) is greater than "0". There is thus a difference between the two values of the secondary current. This means that, when the high frequency noise is generated, the electrical appliance electrically connected to the secondary side of the branch breaker 12 is turned on from the off state. In other words, the high frequency noise detected at the timing (b) is the switching noise of the electrical appliance. When determining that there is a difference between the values of the secondary current before and after the timing (b), the processor 33 continues to monitor the high frequency noise and the secondary current.

At the timing (c) in FIG. 19, when the detection signal is determined as the high frequency noise at the threshold or more, the processor 33 calculates a difference between the values of the secondary current before and after the timing (c). According to the current waveform in FIG. 19, both values of the secondary current before and after the timing (c) are greater than "0" and there is no difference between the two values of the secondary current. This means that, when the high frequency noise is generated, the electrical appliance electrically connected to the secondary side of the branch breaker 12 is in the on state. In other words, the high frequency noise detected at the timing (c) is not the switching noise of the electrical appliance. When determining that there is no difference between the values of the secondary current before and after the timing (c), the processor 33 outputs a control signal to sound an alarm or a control signal to break the branch breaker 12.

At the timing (d) in FIG. 19, when the detection signal is determined as the high frequency noise at the threshold or more, the processor 33 calculates a difference between the values of the secondary current before and after the timing (d). According to the current waveform in FIG. 19, the value of the secondary current before the timing (d) is greater than "0" and the value of the secondary current after the timing (d) is "0". There is thus a difference between the two values of the secondary current. This means that, when the high frequency noise is generated, the electrical appliance electrically connected to the secondary side of the branch breaker 12 is turned off from the on state. In other words, the high frequency noise detected at the timing (d) is the switching noise of the electrical appliance. When determining that there is a difference between the values of the secondary current before and after the timing (d), the processor 33 continues to monitor the high frequency noise and the secondary current.

<Processing by Processor in Fourth Embodiment>

Figure 20:
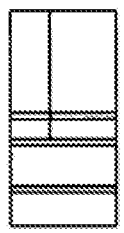
FIG. 20 is a schematic illustration of respective current waveforms of a refrigerator, an air conditioner, a television set, and a microwave oven.
Figure 20:
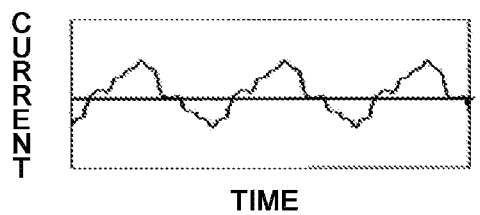
Figure 20:
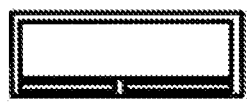
Figure 20:
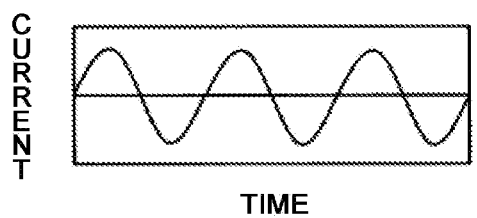
Figure 20:
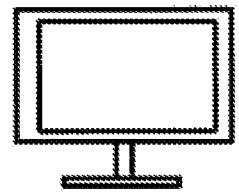
Figure 20:
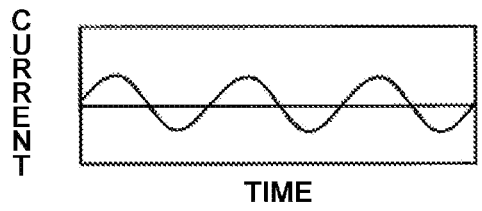
Figure 20:
Figure 20:
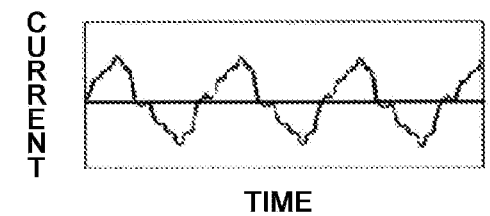
Figure 21A:
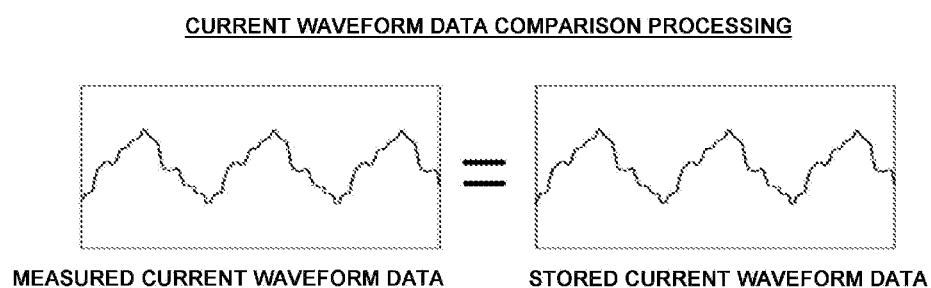
FIG. 21A is a schematic illustration of current waveform data comparison processing by the processor.
Figure 21B:
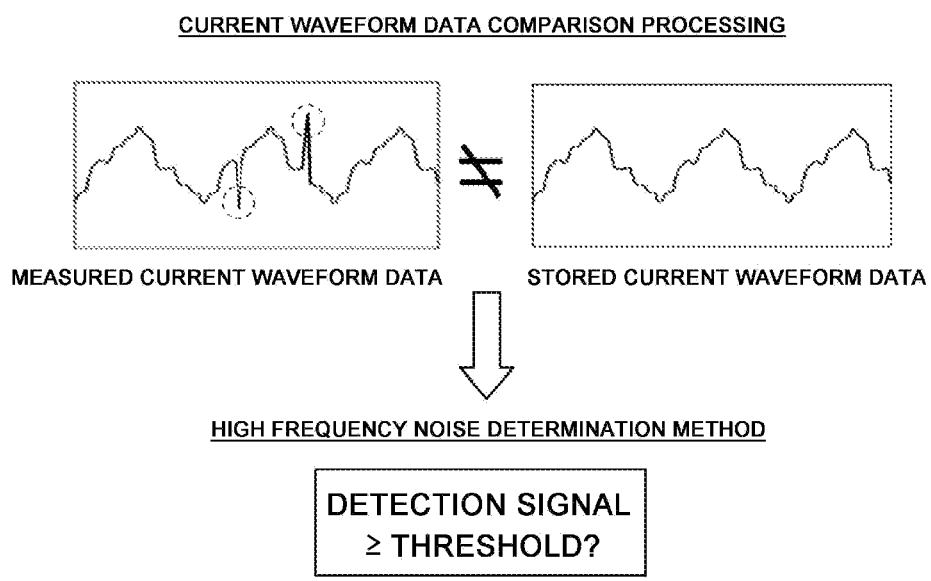
FIG. 21B is a schematic illustration of current waveform data comparison processing and high frequency noise determination processing by the processor.
Figure 22:
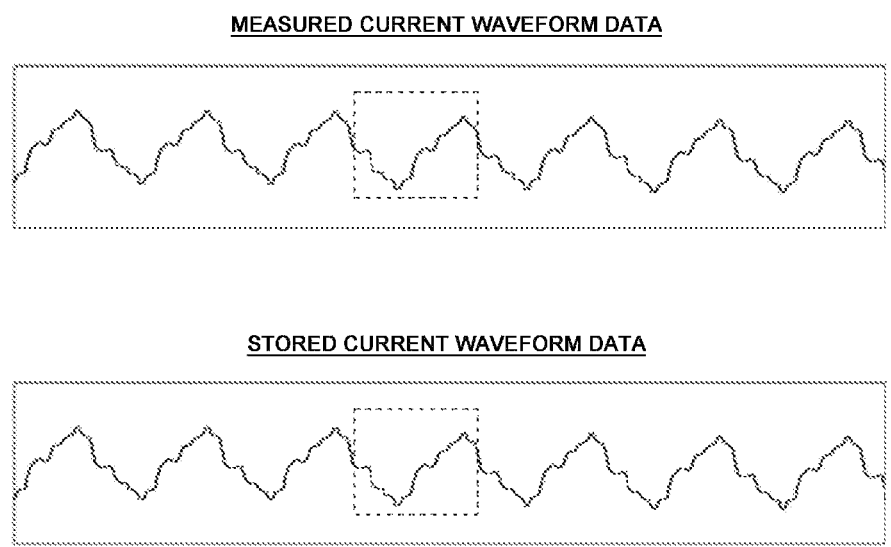
FIG. 22 is a schematic illustration of part of current waveform data used for the current waveform data comparison processing.

The processing by the processor 33 in the fourth embodiment is then described referring to FIGS. 20 through 22. The processing in the present embodiment described below is executed by, for example, the discharge phenomenon detection structure illustrated in FIG. 18. The processor 33 in the present embodiment monitors current waveform data of loads electrically connected to the receptacles all the time and determines whether the high frequency noise at the threshold or more is detected only when an abnormal state is detected in the current waveform data.

As illustrated in FIG. 20, the loads, such as a refrigerator, an air conditioner, a television set, and a microwave oven, generate unique current waveforms due to the differences in respective electrical operations. These current waveforms are measured based on the secondary current of the current detection sections 60 illustrated in FIG. 18. The storage section 34 stores current waveform data for at least one period measured in the past. The current waveform data is data containing the values of the secondary current of each current detection section 60 sorted on the time series and is data amplified by the amplification section 31 and converted to digital signals by the A/D converter 32. The storage section 34 stores a plurality of current waveform data items different for each of the plurality of loads.

As illustrated in FIG. 21A, the processor 33 monitors the current waveform data of the loads all the time and compares the measured current waveform data with the current waveform data stored in the storage section 34. When the measured current waveform data is substantially same as the stored current waveform data, the processor 33 repeats the comparison processing.

Meanwhile, as illustrated in FIG. 21B, when the measured current waveform data is different from the stored current waveform data, the processor 33 determines whether the detection signal output from the noise detection section 20 is the high frequency noise at the threshold or more. When the detection signal is determined as the high frequency noise at the threshold or more, the processor 33 outputs a control signal to sound an alarm or a control signal to break the branch breaker 12. In contrast, when the detection signal is determined not as the high frequency noise at the threshold or more, the processor 33 repeats the processing of comparing the measured current waveform data with the stored current waveform data.

It should be noted that the current waveform data to be stored in the storage section 34 is not limited to the data for one period. For example, as illustrated in FIG. 22, the current waveform data may be configured to be stored for multiple periods in the storage section 34. In this case, the processor 33 extracts respective current waveform data for one period (refer to the areas surrounded by a broken line in FIG. 22) from the measured current waveform data for multiple periods and the stored current waveform data for multiple periods. The processor 33 compares the current waveform data for one period thus extracted with each other.

<Processing by Processor in Fifth Embodiment>

Figure 23:
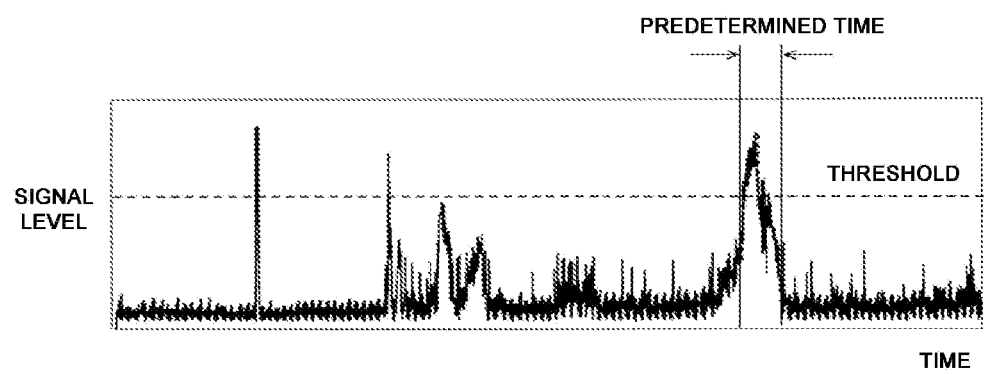
FIG. 23 is a graph illustrating relationship between signal levels of the detection signal detected by the noise detection section and time.

The processing by the processor 33 in the fifth embodiment is then described referring to FIG. 23. The processing in the present embodiment described below is executed by, for example, the discharge phenomenon detection structure illustrated in FIG. 18.

As described earlier, the processor 33 determines whether the signal level of the detection signal from the noise detection section 20 is at the threshold or more to detect an abnormal discharge phenomenon. Meanwhile, the signal level of the switching noise of the electrical appliance is sometimes at the threshold or more although only for a moment. Switching noise is not an abnormal discharge phenomenon to break the branch breakers 12. The processor 33 thus has to distinguish switching noise from an abnormal discharge phenomenon to break the branch breakers 12.

As illustrated in FIG. 23, after determining that the signal level of the detection signal from the noise detection section 20 is at the threshold or more, the processor 33 in the present embodiment counts duration time of the signal level at the threshold or more. When the duration time of the signal level at the threshold or more reaches a predetermined time defined in advance, the processor 33 outputs a control signal to sound an alarm or a control signal to break the branch breaker 12.

It should be noted that, in the specific example illustrated in FIG. 23, the duration time of the signal level at the threshold or more does not reach the predetermined time and thus the processor 33 executes neither the processing to sound an alarm nor the processing to break the branch breaker 12.

Action and Effect

The distribution board 1 in the present embodiments illustrated in FIGS. 1 through 23 is capable of detecting the occurrence and the source of an abnormal discharge phenomenon by relatively simple determination processing of the processor 33. The distribution board 1 in the present embodiments thus does not have to perform complex frequency analysis having been practiced in the past.

The distribution board 1 in the present embodiments is capable of processing the detection signals from the plurality of noise detection sections 20 using the single processor 33 and also capable of controlling the plurality of branch breakers 12 using the single processor 33. As a result, the same number of processors 33 as the numbers of the noise detection sections 20 and the branch breakers 12 do not have to be prepared, and thus allows reduction in costs, size, and installation space of the distribution board 1.

Other Modifications

The distribution board of the present invention is not limited to the embodiments described above as illustrated in FIGS. 1 through 23. For example, the distribution board of the present invention is not limited to the applications for regular houses as illustrated in FIG. 1. The distribution board of the present invention is capable of being installed in, for example, stores, factories, warehouses, construction sites, exhibition halls, photovoltaic power plants, office buildings, and the like.

DESCRIPTION OF REFERENCE NUMERALS

1 Distribution board
11 Main Breaker
12 Branch Breaker
11*a*, 12*a* Breaking Section
13 Bus Bar
14 Wiring
20 Noise Detection Section (High-Pass Filter)
21 Resistor
22 Capacitor
23 Detection Section
31 Amplification Section
32 A/D Converter
33 Processor
34 Storage Section
40 Low-Pass Filter
50 Main Noise Detection Section (High-Pass Filter)
51 Resistor
52 Capacitor
53 Detection Section
60 Current Detection Section (Current Transformer)
200 Noise Detection Section Unit
400 Low-Pass Filter Unit
500 Combined Unit

The invention claimed is:

1. A distribution board having a main breaker and a plurality of branch breakers, the distribution board being wired to branch power supplied to the main breaker into each branch breaker, the distribution board comprising:

a plurality of noise detection sections configured to correspond to the respective branch breakers one-to-one and each configured to output a detection signal based on a noise component of not less than a predetermined frequency generated on a secondary side of each branch breaker; and a processor configured to separately receive the detection signal output from each noise detection section and determine whether the detection signal is high frequency noise at a threshold or more.

2. The distribution board according to claim 1, wherein the plurality of noise detection sections configure one unit and each noise detection section of the unit is electrically connected to the respective branch breaker in a one-to-one correspondence.

3. The distribution board according to claim 1, wherein the processor specifies a source of the noise component based on, when the detection signals are received in a predetermined time, a magnitude of a signal level of each detection signal and/or a reception time of each detection signal.

4. The distribution board according to claim 1, further comprising a plurality of low-pass filters configured to be electrically connected to a primary side of the respective branch breakers or the respective noise detection sections to correspond to the respective branch breakers or the respective noise detection sections one-to-one and configured to break a noise component of not less than a predetermined frequency.

5. The distribution board according to claim 1, wherein the processor outputs, when the detection signal is determined as the high frequency noise at a threshold or more, a control signal to the branch breaker corresponding to the noise detection section, one-to-one, having output the detection signal, thereby causing the branch breaker to be in a broken state.

6. The distribution board according to claim 1, further comprising a storage section capable of storing information, wherein
the processor causes the storage section to store a result of processing based on reception of the detection signal and executes processing based on information stored in the storage section.

7. The distribution board according to claim 1, further comprising current detection sections configured to correspond to the respective noise detection sections one-to-one and each configured to detect a current on a secondary side of the respective noise detection section, wherein
the processor determines, when the detection signal is determined as the high frequency noise at a threshold or more, whether an abnormal state occurs by comparing a first current detected before receiving the detection signal with a second current detected after receiving the detection signal.

8. The distribution board according to claim 7, wherein the processor determines that the abnormal state occurs when determining that there is no difference between the first current and the second current.

9. The distribution board according to claim 7, wherein the processor determines that the abnormal state does not occur when determining that there is a difference between the first current and the second current.

10. The distribution board according to claim 1, further comprising:
current detection sections configured to correspond to the respective noise detection sections one-to-one and each configured to detect a current on a secondary side of the respective noise detection sections; and
a storage section capable of storing information, wherein
in the storage section, past current waveform data measured based on a result detected by each current detection section, and
the processor determines, when present current waveform data measured based on the result detected by each current detection section is different from the past current waveform data stored in the storage section, whether the detection signal output from the noise detection section is the high frequency noise at a threshold or more.

\* \* \* \* \*